(12) United States Patent
Kang et al.

(10) Patent No.: US 8,324,055 B2
(45) Date of Patent: *Dec. 4, 2012

(54) METHODS OF MANUFACTURING BURIED WIRING TYPE SUBSTRATE AND SEMICONDUCTOR DEVICE INCORPORATING BURIED WIRING TYPE SUBSTRATE

(75) Inventors: Pil-Kyu Kang, Anyang-si (KR); Dae-Lok Bae, Seoul (KR); Gil-Heyun Choi, Seoul (KR); Jong-Myeong Lee, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/044,703

(22) Filed: Mar. 10, 2011

(65) Prior Publication Data

US 2011/0223725 A1 Sep. 15, 2011

(30) Foreign Application Priority Data

Mar. 12, 2010 (KR) ........................ 10-2010-0022161

(51) Int. Cl.
*H01L 21/30* (2006.01)
*H01L 21/46* (2006.01)
(52) U.S. Cl. ................. 438/270; 438/458; 257/E21.411
(58) Field of Classification Search .................. 438/151, 438/268–274, 458, 459, 106–109
See application file for complete search history.

(56) References Cited

U.S. PATENT DOCUMENTS

| | | | | |
|---|---|---|---|---|
| 6,191,007 | B1 * | 2/2001 | Matsui et al. | 438/459 |
| 6,534,380 | B1 * | 3/2003 | Yamauchi et al. | 438/455 |
| 7,964,463 | B2 * | 6/2011 | Kang | 438/270 |
| 8,015,902 | B2 * | 9/2011 | Hyatt et al. | 82/1.11 |
| 2008/0213973 | A1 * | 9/2008 | Dao | 438/458 |
| 2009/0090947 | A1 * | 4/2009 | Yoon et al. | 257/296 |
| 2009/0108318 | A1 * | 4/2009 | Yoon et al. | 257/306 |
| 2009/0230466 | A1 * | 9/2009 | Kim | 257/331 |
| 2010/0176482 | A1 * | 7/2010 | Dennard et al. | 257/506 |
| 2010/0203695 | A1 * | 8/2010 | Oh et al. | 438/270 |
| 2011/0215407 | A1 * | 9/2011 | Tang et al. | 257/348 |

FOREIGN PATENT DOCUMENTS

| | | |
|---|---|---|
| JP | 05029573 A | 2/1993 |
| JP | 05055586 A | 3/1993 |
| KR | 1020010063426 A | 7/2001 |

* cited by examiner

*Primary Examiner* — Savitr Mulpuri
(74) *Attorney, Agent, or Firm* — Volentine & Whitt, PLLC

(57) ABSTRACT

A method of manufacturing a buried wiring type substrate comprises implanting hydrogen ions into a single crystalline substrate through a first surface thereof to form an ion implantation region, forming a conductive layer comprising a metal on the first surface of the single crystalline substrate, forming an insulation layer comprising silicon oxide on the conductive layer, bonding the insulation layer to a support substrate to form a preliminary buried wiring type substrate, and separating the single crystalline substrate at the ion implantation region to form a single crystalline semiconductor layer on the conductive layer.

8 Claims, 21 Drawing Sheets

METHODS OF MANUFACTURING BURIED WIRING TYPE SUBSTRATE AND SEMICONDUCTOR DEVICE INCORPORATING BURIED WIRING TYPE SUBSTRATE

CROSS-REFERENCE TO RELATED APPLICATIONS

This application claims priority under 35 U.S.C. §119 to Korean Patent Application No. 10-2010-0022161 filed on Mar. 12, 2010, the disclosure of which is hereby incorporated by reference in its entirety.

BACKGROUND OF THE INVENTION

Embodiments of the inventive concept relate generally to electronic data processing technologies. More particularly, embodiments of the inventive concept relate to buried wiring type substrates for semiconductor devices, semiconductor devices having the buried wiring type substrates, and methods of manufacturing the substrates and the semiconductor devices.

Many semiconductor devices are manufactured on a semiconductor-on-insulator (SOI) substrate in which a silicon oxide layer is buried under a thin semiconductor film. The use of the SOI substrate can facilitate the formation of highly integrated devices. Some semiconductor devices are also manufactured on an SOI substrate having a conductive film buried under the semiconductor film. The buried conductive film is used to form buried wiring for the semiconductor devices.

Unfortunately, the buried wiring can exhibit undesirably high resistance for various reasons. For instance, the resistance can be undesirably high if the conductive film is inadequately adhered to the semiconductor film, if a cross sectional area of the buried wiring is too small, or if an inadequate amount of conductive material is used in the buried conductive film.

SUMMARY OF THE INVENTION

Embodiments of the inventive concept provide buried wiring type substrates having a relatively low resistance and methods of manufacturing the buried wiring type substrates. Embodiments of the inventive concept further provide semiconductor devices having the buried wiring type substrate and methods of manufacturing the semiconductor devices.

According to one embodiment of the inventive concept, a method of manufacturing a buried wiring type substrate comprises implanting hydrogen ions into a single crystalline substrate through a first surface thereof to form an ion implantation region, forming a conductive layer comprising a metal on the first surface of the single crystalline substrate, forming an insulation layer comprising silicon oxide on the conductive layer, bonding the insulation layer to a support substrate to form a preliminary buried wiring type substrate, and separating the single crystalline substrate at the ion implantation region to form a single crystalline semiconductor layer on the conductive layer.

In certain embodiments, the ion implantation region is formed at a distance between about 1,000 and about 10,000 Å from the first surface of the single crystalline substrate.

In certain embodiments, the method further comprises forming a barrier layer on the single crystalline substrate before forming the conductive layer.

In certain embodiments, the barrier layer comprises at least one of titanium, titanium nitride, tantalum, tantalum nitride, tungsten, tungsten nitride, tungsten silicide, nickel silicide, and cobalt silicide.

In certain embodiments, the conductive layer comprises at least one of tungsten, aluminum, copper, tungsten silicide, nickel silicide, and cobalt silicide.

In certain embodiments, implanting the hydrogen ions into the single crystalline substrate, forming the conductive layer, forming the insulation layer, and bonding the insulation layer to the support substrate are performed at a temperature less than or equal to about 400° C.

In certain embodiments, the support substrate comprises a single crystalline substrate, a polysilicon substrate, or an amorphous silicon substrate.

In certain embodiments, the method further comprises hydrophilizing the insulation layer and the support substrate before bonding the insulation layer to the support substrate.

According to another embodiment of the inventive concept, a method of manufacturing a semiconductor device comprises implanting hydrogen ions into a donor substrate through a first surface thereof to form an ion implantation region, the donor substrate comprising a single crystalline semiconductor, forming a conductive layer comprising a metal on the first surface of the donor substrate, forming an insulation layer comprising silicon oxide on the conductive layer, bonding the insulation layer to a support substrate, cutting the donor substrate at the ion implantation region to form a single crystalline semiconductor layer, patterning the single crystalline semiconductor layer in a first region to form a first active structure comprising a first lower pattern and a first upper pattern, the first lower pattern extending in a first direction, and the first upper pattern protruding from the first lower pattern, etching the conductive layer using the first active structure as an etching mask to form a buried wiring between the first active structure and the insulation layer, the buried wiring extending in the first direction, sequentially forming a first gate insulation layer and a first gate electrode on a sidewall of the first upper pattern, forming a first impurity region at the first lower pattern, the first impurity region being electrically connected to the buried wiring, and forming a second impurity region at the first upper pattern, the second impurity region being formed above the first gate electrode.

In certain embodiments, the method further comprises forming an insulating interlayer on the insulation layer to cover the first active structure, forming a first contact plug through the insulating interlayer, the first contact plug being electrically connected to the first gate electrode, and forming a second contact plug through the insulating interlayer, the second contact plug being electrically connected to the first impurity region and the buried wiring.

In certain embodiments, the method further comprises patterning the single crystalline semiconductor layer in a second region to form a second active structure, and etching the conductive layer using the second active structure as an etching mask to form a conductive structure.

In certain embodiments, the first impurity region makes contact with the buried wiring.

In certain embodiments, forming the first active structure comprises forming a first mask on the single crystalline semiconductor layer, the first mask extending in the first direction, partially etching the single crystalline semiconductor layer using the first mask to form a preliminary first upper pattern, partially etching the crystalline semiconductor layer to form the lower pattern below the first upper pattern, forming a second mask on the preliminary first upper pattern, the second mask extending in a second direction substantially perpendicular to the first direction, and patterning the preliminary first upper pattern using the second mask as an etching mask to form the first upper pattern.

In certain embodiments, the method further comprises forming a spacer on a sidewall of the preliminary first upper pattern, and implanting first impurities into the single crystalline semiconductor layer to form a preliminary first impurity region.

In certain embodiments, partially etching the crystalline semiconductor layer to form the lower pattern comprises converting the preliminary first impurity region to a first impurity region.

In certain embodiments, the method further comprises forming a second gate insulation layer on the second active structure, forming a second gate electrode on the second gate insulation layer, and forming third and fourth impurity regions at upper portions of the second upper pattern adjacent to the second gate electrode.

According to another embodiment of the inventive concept, a buried wiring type substrate comprises a barrier layer formed on an insulation layer and comprising a metal, a metal nitride, or a metal silicide, a conductive layer formed on the barrier layer and comprising a metal, a metal nitride, or a metal silicide, and a single crystalline semiconductor layer formed on the conductive layer.

In certain embodiments, the insulation layer comprises silicon oxide.

In certain embodiments, the insulation layer is bonded to a support substrate.

In certain embodiments, the single crystalline semiconductor layer has a thickness between about 1,000 and about 10,000 Å.

BRIEF DESCRIPTION OF THE DRAWINGS

The drawings illustrate selected embodiments of the inventive concept. In the drawings, like reference numbers indicate like features. In addition, the relative dimensions of certain features may be exaggerated for clarity of illustration.

DETAILED DESCRIPTION

Figure 1:
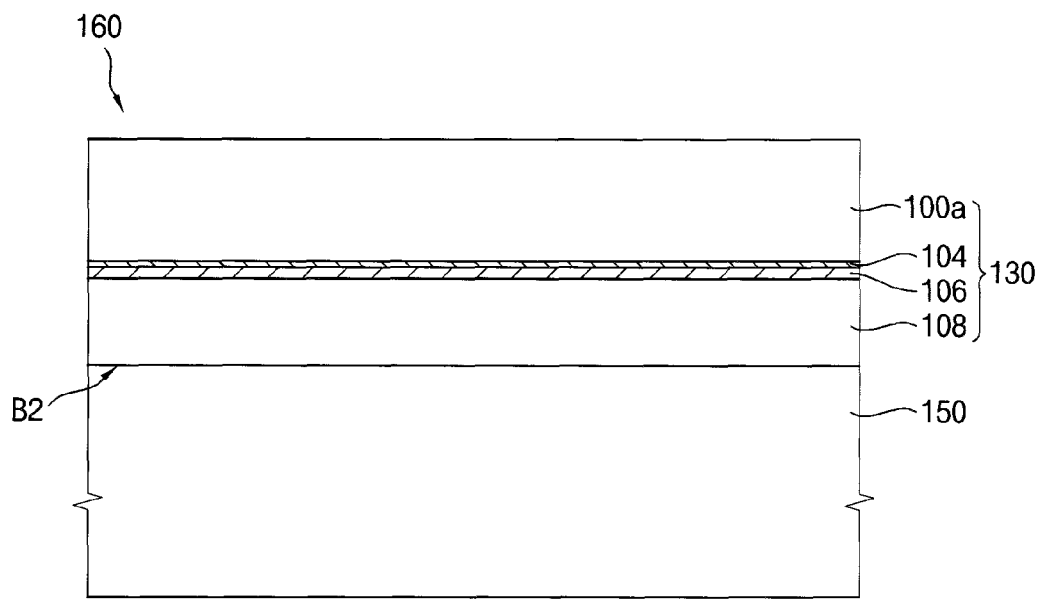
FIG. 1 is a cross-sectional view illustrating a buried wiring type substrate according to an embodiment of the inventive concept.

Embodiments of the inventive concept are described below with reference to the accompanying drawings. These embodiments are presented as teaching examples and should not be construed to limit the scope of the inventive concept.

In the description that follows, where a feature is referred to as being "on," "connected to" or "coupled to" another feature, it can be directly on, connected or coupled to the other feature or intervening features may be present. In contrast, where a feature is referred to as being "directly on," "directly connected to," or "directly coupled to" another feature, there are no intervening features present. As used herein, the term "and/or" indicates any and all combinations of one or more of the associated listed items.

The terms first, second, etc., are used herein to describe various features, but the described features are not to be limited by these terms. Rather, these terms are merely used to distinguish between different features. Thus, for example, a first feature discussed below could be termed a second feature without departing from the scope of the inventive concept.

Spatially relative terms, such as "beneath," "below," "lower," "above," and "upper" are used herein to indicate a feature's relationship to another feature as illustrated in the figures. The spatially relative terms, however, are intended to encompass different orientations of the device in use or operation in addition to the orientation depicted in the figures. For example, where a device in the figures is turned over, features described as "below" or "beneath" other features would then be oriented "above" the other features. Thus, the term "below" can encompass both an orientation of above and below. The device can be otherwise oriented (rotated 90 degrees or at other orientations) with the spatially relative descriptors interpreted accordingly.

The terminology used herein is for the purpose of describing particular embodiments only and is not intended to be limiting of the inventive concept. As used herein, the singular forms "a," "an" and "the" are intended to encompass plural forms as well, unless the context clearly indicates otherwise. The terms "comprises" and/or "comprising," where used in this specification, indicate the presence of stated features but do not preclude the presence or addition of additional features or groups of features.

Certain embodiments are described herein with reference to schematic illustrations of idealized embodiments (and intermediate structures). Variations are to be expected from the shapes of the illustrations as a result of, for example, manufacturing techniques and/or tolerances. Thus, embodiments should not be construed as limited to the particular shapes of regions illustrated herein but are to include various deviations in shapes. For example, an implanted region illustrated as a rectangle will typically have rounded or curved features and/or a gradient of implant concentration at its edges rather than a binary change from an implanted to a non-implanted region. Similarly, a buried region formed by implantation may result in some implantation in the region between the buried region and the surface through which the implantation takes place.

Unless otherwise defined, all terms (including technical and scientific terms) used herein have the same meaning as commonly understood by one of ordinary skill in the art. Terms such as those defined in commonly used dictionaries should be interpreted as having a meaning that is consistent with their meaning in the context of the relevant art and will not be interpreted in an idealized or overly formal sense unless expressly so defined herein.

FIG. 1 is a cross-sectional view illustrating a buried wiring type substrate according to an embodiment of the inventive concept.

Referring to FIG. 1, a buried wiring type substrate 160 comprises a support substrate 150 and a structure 130.

Support substrate 150 can take a variety of forms, such as a single crystalline semiconductor substrate, a low quality substrate including defects or particles, an amorphous silicon substrate, or a polysilicon substrate.

Structure 130 is attached to support substrate 150. Structure 130 comprises a conductive layer 106, a barrier layer 104 and a single crystalline semiconductor layer 100a sequentially stacked on support substrate 150. Structure 130 further comprises an insulation layer 108 between conductive layer 106 and support substrate 150. In some embodiments, insulation layer 108 comprises silicon oxide. An additional insulation layer (not shown) can be further formed between conductive layer 106 and insulation layer 108.

Insulation layer 108 is bonded to a top surface B2 of support substrate 150. A bottom surface of insulation layer 108 bonded to top surface B2 is flat.

Conductive layer 106 serves as wiring and is formed between single crystalline semiconductor layer 100a and support substrate 150.

Single crystalline semiconductor layer 100a is typically formed of single crystalline silicon having a thickness less than about 1 μm. In some embodiments, single crystalline semiconductor layer 100a has a thickness of about 1,000 to 6,000 Å. Single crystalline semiconductor layer 100a has a flat top surface and a relatively small thickness to allow the formation of semiconductor devices thereon.

Barrier layer 104 serves as an ohmic layer between single crystalline semiconductor layer 100a and conductive layer 106. Barrier layer 104 prevents diffusion of metal in conductive layer 106. Barrier layer 104 typically comprises a metal, a metal nitride, and/or a metal silicide. For example, in some embodiments, barrier layer 104 comprises titanium, titanium nitride, tantalum, tantalum nitride, tungsten, tungsten nitride, tungsten silicide, nickel silicide, or cobalt silicide. These materials can be used alone or in combination. Barrier layer 104 is typically formed by depositing a material at a temperature less than or equal to about 400° C.

Conductive layer 106 typically comprises a metal or a metal silicide having a low resistance. For example, in some embodiments, conductive layer 106 comprises tungsten, aluminum, copper, tungsten silicide, nickel silicide, or cobalt silicide. Conductive layer 106 is typically formed by depositing a material at a temperature less than or equal to 400° C. Conductive layer 106 generally comprises a metal that is not melted and bonded to silicon, and thus conductive layer 106 can comprise various kinds of metal.

Insulation layer 108 typically comprises a silicon oxide deposited at a temperature less than or equal to about 400° C. For example, insulation layer 108 can comprise high density plasma (HDP) oxide, spin-on-glass (SOG) oxide, or tetra ethyl ortho silicate (TEOS).

Because buried wiring type substrate 160 comprises conductive layer 106 and barrier layer 104 having relatively low resistances, it can be used effectively to form semiconductor devices having buried wirings.

FIGS. 2 through 7 are cross-sectional views illustrating a method of manufacturing the buried wiring type substrate of FIG. 1 according to an embodiment of the inventive concept.

Figure 2:
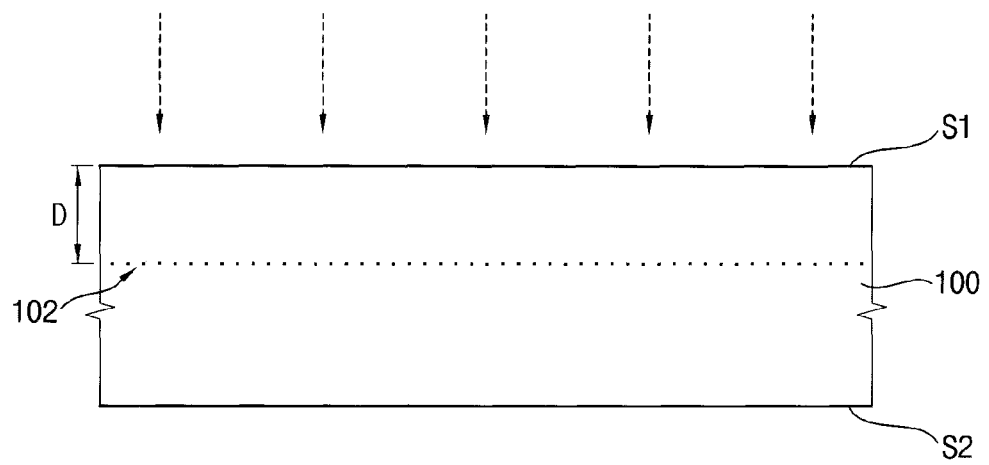
FIGS. 2 through 7 are cross-sectional views illustrating a method of manufacturing the buried wiring type substrate of FIG. 1 according to an embodiment of the inventive concept.

Referring to FIG. 2, a donor substrate 100 is prepared. Donor substrate 100 is to be bonded to support substrate 150, as will be described with reference to FIG. 5. Donor substrate 100 provides a semiconductor layer for forming devices. Donor substrate 100 typically comprises a single crystalline semiconductor that is substantially free of defects and particles. Donor substrate 100 has a first surface S1 and a second surface S2. First surface S1 is subsequently bonded to support substrate 150.

Hydrogen ions are implanted into donor substrate 100 through first surface S1 to form a hydrogen ion implantation region 102. Subsequently, donor substrate 100 is cut at hydrogen ion implantation region 102, so a distance D from first surface S1 to hydrogen ion implantation region 102 defines a thickness of single crystalline semiconductor layer 100a to be formed subsequently as described in relation to FIG. 7.

In an ion implantation process, ions are accelerated by energy at a high voltage to penetrate through a surface of a material layer. The ions are thus implanted into a target region of the material layer. Distance D from first surface S1 to hydrogen ion implantation region 102 is controlled according to the magnitude of the energy. Additionally, the ion distribution of hydrogen ion implantation region 102 is controlled according to the amount of ions implanted into donor substrate 100.

Where distance D is greater than about 1 μm, single crystalline semiconductor layer 100a may have too large a thickness to manufacture devices thereon. Where distance D is less than about 1,000 Å, donor substrate 100 may not be cut precisely at hydrogen ion implantation region 102. Thus, distance D is typically set between about 1,000 and 1 μm or between about 1,000 and 6,000 Å.

Figure 3:
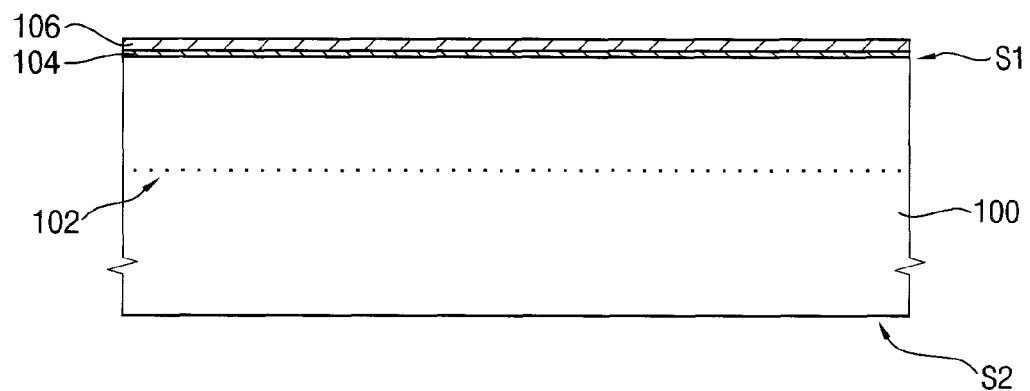

Referring to FIG. 3, barrier layer 104 is formed on first surface S1 of donor substrate 100. Barrier layer 104 typically comprises a material deposited at a temperature less than or equal to about 400° C. In some embodiments, barrier layer 104 comprises a material deposited at a temperature less than or equal to about 350° C.

Where barrier layer 104 is deposited at a temperature above 400° C., donor substrate 100 can be separated into two at hydrogen ion implantation region 102. However, where barrier layer 104 is deposited at a temperature less than or equal to about 400° C., donor substrate 100 is generally not separated at hydrogen ion implantation region 102. Barrier layer 104 is typically formed using a metal, a metal nitride and/or a metal silicide. For example, barrier layer 104 can be formed using titanium, titanium nitride, tantalum, tantalum nitride, tungsten, tungsten nitride, tungsten silicide, nickel silicide, or cobalt silicide. These materials can be used alone or in combination.

Conductive layer 106 is formed on barrier layer 104. Conductive layer 106 is typically formed using a material deposited at a temperature less than or equal to about 400° C. In some embodiments, conductive layer 106 is formed at a temperature less than or equal to about 350° C. Conductive layer 106 is deposited at a temperature low enough to prevent separation of donor substrate 100. Conductive layer 106 can be formed using a metal or a metal silicide having a low resistance. For example, conductive layer 106 can be formed using tungsten, aluminum, copper, tungsten silicide, nickel silicide, or cobalt silicide.

Figure 4:
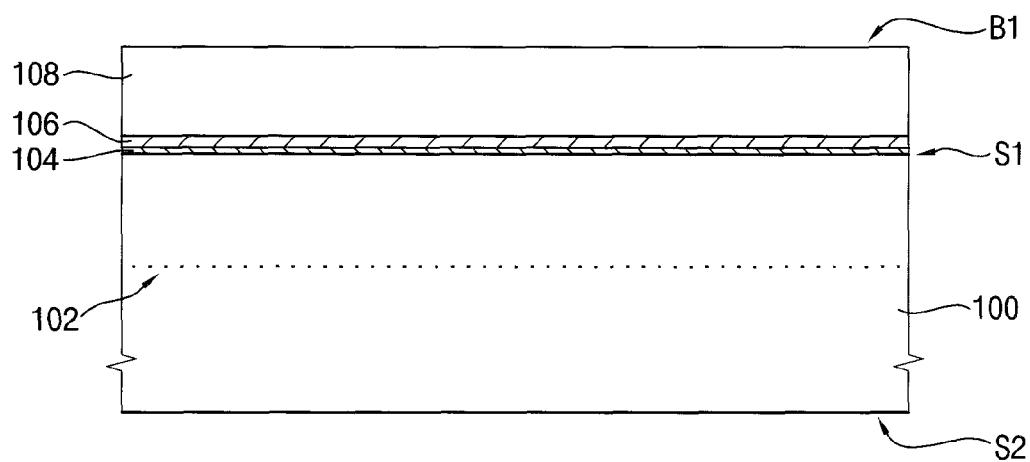

Referring to FIG. 4, insulation layer 108 is formed on conductive layer 106. Insulation layer 108 is formed using silicon oxide. Insulation layer 108 is formed at a temperature less than or equal to about 400° C. Insulation layer 108 is generally formed of a material such as HDP oxide, SOG oxide, or TEOS. A top surface B1 of insulation layer 108 is bonded to support substrate 150.

As indicated by the foregoing, barrier layer 104, conductive layer 106 and insulation layer 108 are sequentially formed on first surface S1 of donor substrate 100.

Figure 5:
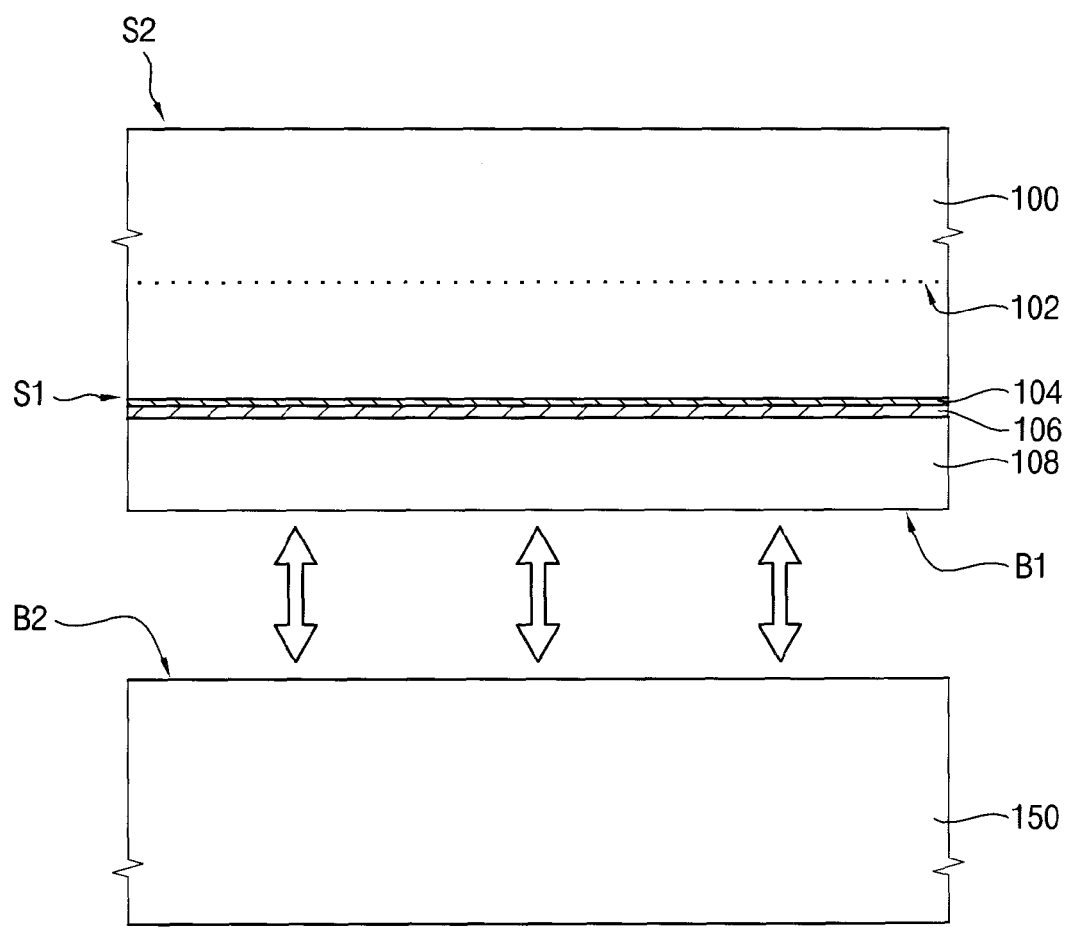
Figure 6:
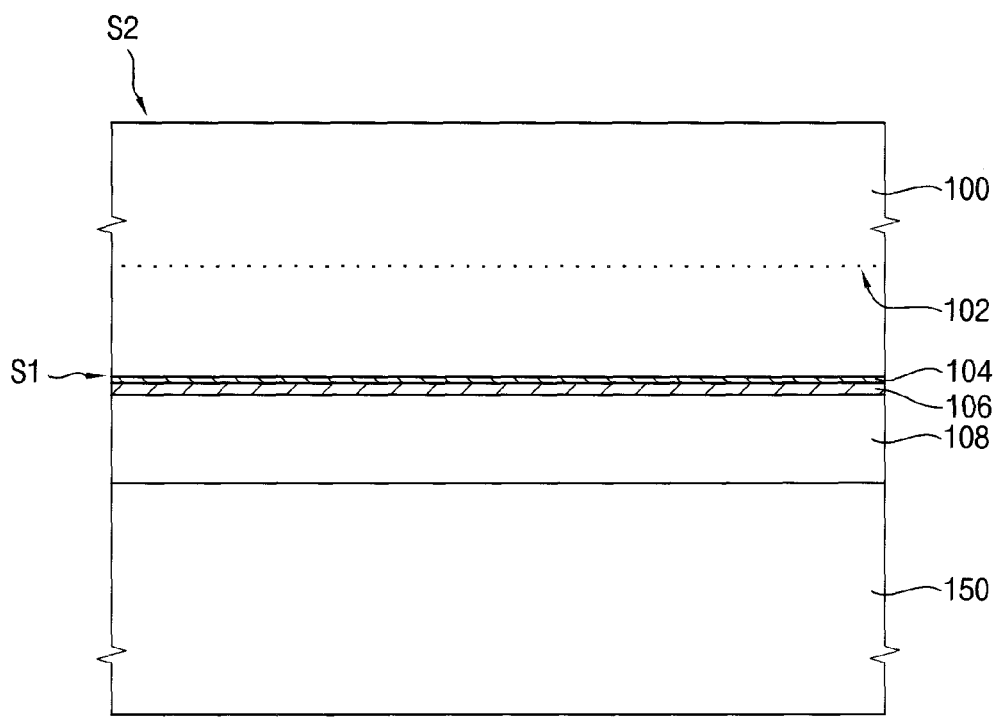

Referring to FIGS. 5 and 6, top surface B1 of insulation layer 108 is bonded to a top surface B2 of support substrate 150. Top surfaces B1 and B2 are hydrophilized by providing water thereto. Where the hydrophilized top surfaces B1 and B2 contact each other, support substrate 150 and donor substrate 100 are bonded to each other by Van Der Waals Force between hydroxyl groups thereof. The bonding can be performed at a room temperature or at a temperature below about 400° C. to prevent separation of donor substrate 100. In certain embodiments, the bonding is performed at a room temperature of about 25° C. The above process can improve the bonding of top surfaces B1 and B2.

Figure 7:
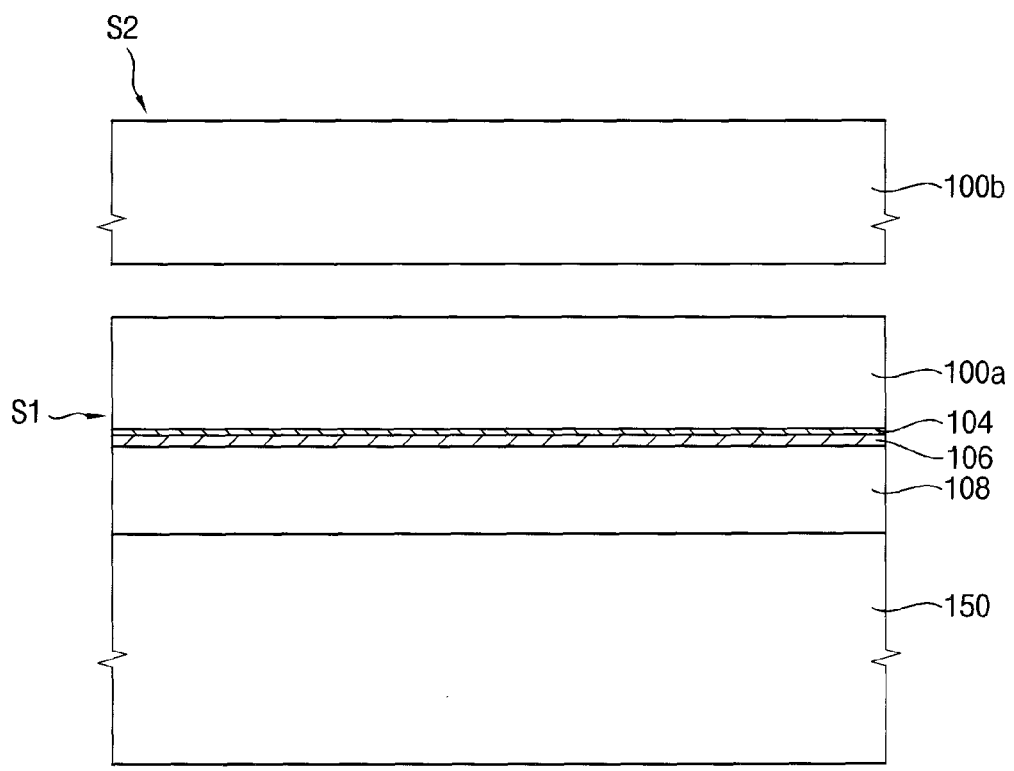

Referring to FIG. 7, donor substrate 100 is cut at hydrogen ion implantation region 102 so that donor substrate 100 is separated into two single crystalline semiconductor layers 100a and 100b. The cutting is performed at a temperature above about 400° C. Single crystalline semiconductor layer 100a has a thickness below about 1 μm. For example, single crystalline semiconductor layer 100a typically has a thickness in a range of about 1,000 to about 6,000 Å.

Single crystalline semiconductor layer 100b can be used again for forming a buried wiring type substrate because single crystalline semiconductor layer 100b may have characteristics substantially the same as those of single crystalline semiconductor layer 100a except for its thickness. Thus, donor substrate 100 can be repeatedly used so that the cost of buried wiring type substrate 160 is decreased.

Figure 8:
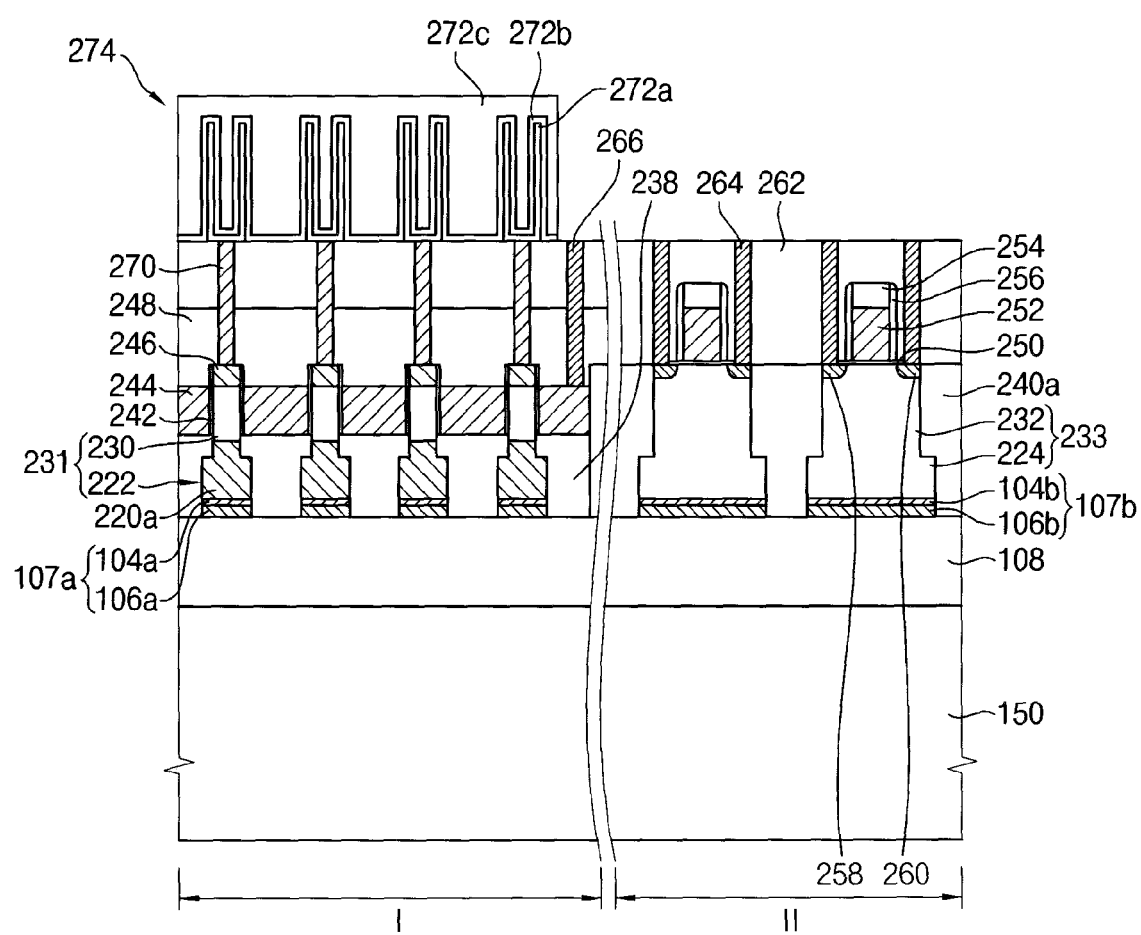
FIGS. 8 and 9 are cross-sectional views illustrating a semiconductor device comprising a buried wiring type substrate according to an embodiment of the inventive concept.
Figure 9:
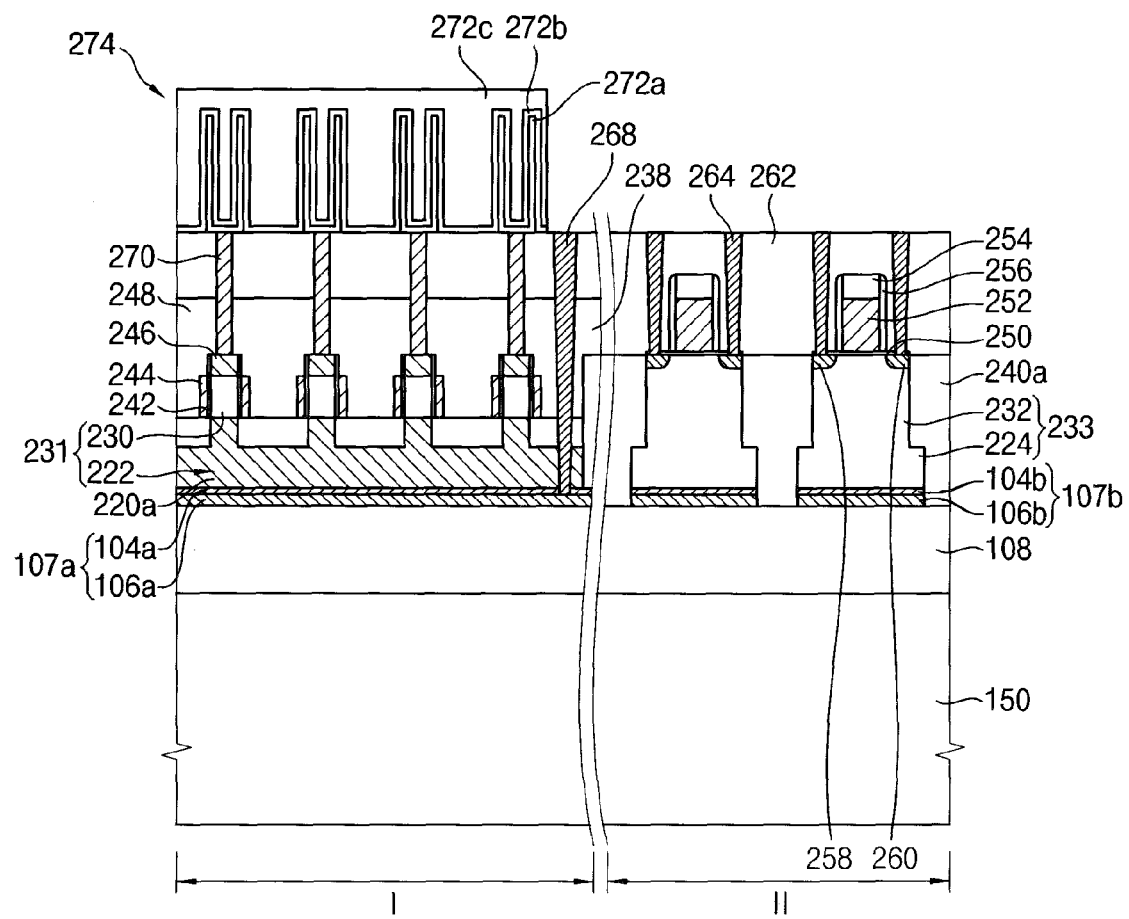

FIGS. 8 and 9 are cross-sectional views illustrating a semiconductor device comprising a buried wiring according to an embodiment of the inventive concept. FIG. 8 is a cross-sectional view cut along a second direction in which a gate electrode extends, and FIG. 9 is a cross-sectional view cut along a first direction in which a first lower pattern of a first active structure extends.

Referring to FIGS. 8 and 9, the semiconductor device comprises support substrate 150, a buried wiring 107a, a first active structure 231, a second active structure 233, a first transistor, a second transistor, and a conductive structure 107b.

Support substrate 150 is divided into a first region I and a second region II. First region I serves as a cell region for forming memory cells, and second region II serves as a peripheral circuit region for forming logic circuits for controlling the memory cells.

Insulation layer 108 is formed directly on top surface B2 of support substrate 150. Insulation layer 108 typically comprises silicon oxide deposited at a temperature less than or equal to about 400° C. Insulation layer 108 can also comprise silicon nitride or silicon oxynitride.

Buried wiring 107a, which comprises a first conductive layer pattern 106a and a first barrier layer pattern 104a sequentially stacked, is formed on insulation layer 108 in first region I. Buried wiring 107a contacts a bottom surface of first active structure 231 in first region I. In some embodiments, buried wiring 107a serves as a bit line. In some embodiments, buried wiring 107a extends in the first direction.

Conductive structure 107b, which comprises a second conductive layer pattern 106b and a second barrier layer pattern 104b sequentially stacked, is formed on insulation layer 108 in second region II. Conductive structure 107b contacts a bottom surface of second active structure 233 in second region II. In some embodiments, conductive structure 107b serves as a wiring.

First and second barrier layer patterns 104a and 104b each comprise a metal, a metal nitride, and/or a metal silicide. For example, in some embodiments, barrier layer patterns 104a and 104b comprise titanium, titanium nitride, tantalum, tantalum nitride, tungsten, tungsten nitride, tungsten silicide, nickel silicide, or cobalt silicide. These materials can be used alone or in combination. Barrier layer patterns 104a and 104b typically comprise a material deposited at a temperature less than or equal to about 400° C.

First and second conductive layer patterns 106a and 106b each comprise a metal. Moreover, in some embodiments, first and second conductive layer patterns 106a and 106b comprise substantially the same metal. Conductive layer patterns 106a and 106b typically comprise a material deposited at a temperature less than or equal to about 400° C.

In certain embodiments, conductive layer patterns 106a and 106b each comprise a metal or a metal silicide having a low resistance. For example, in some embodiments, conductive layer patterns 106a and 106b comprise tungsten, aluminum, copper, tungsten silicide, nickel silicide, or cobalt silicide.

First active structure 231 is formed on buried wiring 107a. First active structure 231 comprises a first lower pattern 222 and a first upper pattern 230. First active structure 231 typically comprises a single crystalline semiconductor, such as single crystalline silicon. First active structure 231 typically has a thickness below about 1 μm. The thickness can be, for instance, about 1,000 to about 6,000 Å.

First lower pattern 222 of first active structure 231 has a first width and is formed on buried wiring 107a. The first width is substantially the same as a width of buried wiring 107a. First lower pattern 222 extends in the first direction.

First upper pattern 230 protrudes from first lower pattern 222 in a third direction substantially perpendicular to top surface B2 of support substrate 150. First upper pattern 230 can take a variety of shapes, such as a pillar shape in the form of a cylinder or canted column. In some embodiments, a plurality of first upper patterns 230 is formed on first lower pattern 222. First upper pattern 230 has a second width smaller than the first width.

First active structures 231 are electrically isolated by a first field insulation layer pattern 238 formed on insulation layer 108. First field insulation layer pattern 238 partially fills spaces between first active structures 231 and between buried wirings 107a. First field insulation layer pattern 238 has a top surface higher than that of first lower pattern 222 and lower than that of first upper pattern 230.

The first transistor is formed on first active structure 231. The first transistor comprises a first gate insulation layer 242, a first gate electrode 244, a first impurity region 220a, and a second impurity region 246. The first transistor has a channel formed in the third direction.

First gate insulation layer 242 is formed on a sidewall of first upper pattern 230 of first active structure 231. In some embodiments, first gate insulation layer 242 surrounds a portion of first upper pattern 230 protruding from first field insulation layer pattern 238. First gate insulation layer 242 typically comprises an oxide or a metal oxide. For example, in some embodiments, first gate insulation layer 242 comprises silicon oxide, hafnium oxide, aluminum oxide, zirconium oxide, or tantalum oxide.

First gate electrode 244 is formed on first field insulation layer pattern 238. First gate electrode 244 surrounds first gate insulation layer 242. First gate electrode 244 extends in the second direction and serves as a word line. First gate electrode 244 typically comprises doped polysilicon, metal, and/or metal silicide. In some embodiments, first gate electrode 244 comprises titanium, titanium nitride, tantalum, tantalum nitride, tungsten, tungsten nitride, tungsten silicide, nickel silicide, or cobalt silicide. These materials can be used alone or in combination.

In some embodiments, first gate electrode 244 has a top surface that is lower than a top surface of first active structure 231. In such embodiments, first active structure 231 protrudes from the top surface of first gate electrode 244.

First and second impurity regions 220a and 246 serve as source/drain regions of the first transistor. In some embodiments, first impurity region 220a is formed at a portion of first active structure 231 below first gate electrode 244, and second impurity region 246 is formed at a portion of first active structure 231 above first gate electrode 244. First and second impurity regions 220a and 246 typically include similar impurities.

In some embodiments, first impurity region 220a extends in the first direction. First impurity region 220a contacts a top surface of buried wiring 107a, so it is electrically connected to buried wiring 107a. Buried wiring 107a, which has a low resistance, serves as a bit line, thereby enhancing the electrical characteristics of the semiconductor device. Second impurity region 246 is formed at an upper portion of first upper pattern 230.

A first insulating interlayer 248 is formed between first gate electrodes 244 and on first field insulation layer pattern 238. First insulating interlayer 248 comprises silicon oxide.

Second active structure 233 is formed on conductive structure 107b in second region II. Second active structure 233 is formed of a second upper pattern 232 and a second lower pattern 224. Second active structure 233 comprises substantially the same material as first active structure 231.

Conductive structure 107b contacts a bottom surface of second active structure 233.

Second upper pattern 232 protrudes from second lower pattern 224 in the third direction. Second upper pattern 232 has a fourth width lower than the third width of second lower pattern 224.

A second field insulation layer pattern 240a is formed between second active structures 233 and between conductive structures 107b on insulation layer 108. Accordingly, second active structures 233 are electrically isolated from each other by second field insulation layer pattern 240a. Second field insulation layer pattern 240a fills spaces between second active structures 233. In some embodiments, second field insulation layer pattern 240a has a top surface coplanar with that of second active structure 233.

In some embodiments, a well region (not shown) is formed at second upper pattern 232 of second active structure 233. The well region has impurities with a conductive type determined by the type of the second transistor. For example, where the second transistor is a PMOS transistor, the well region has n-type impurities. Where the second transistor is an NMOS transistor, the well region has p-type impurities. In some embodiments, second active structures 233 have an island shape and are electrically isolated by second field insulation layer pattern 240a, so impurities in the well regions of second active structures 233 are prevented from migrating.

The second transistor is formed on second active structure 233. The second transistor comprises a second gate insulation layer 250, a gate mask 254, a second gate electrode 252, a third impurity region 258, and a fourth impurity region 260. The second transistor has a channel formed in a horizontal direction. A gate spacer 256 is further formed on sidewalls of gate mask 254 and second gate electrode 252.

Second gate insulation layer 250 is formed on second upper pattern 232 of second active structure 233. Second gate insulation layer 250 comprises an oxide or a metal oxide. For example, second gate insulation layer 250 can comprise silicon oxide, aluminum oxide, hafnium oxide, tantalum oxide, or zirconium oxide. Second gate insulation layer 250 comprises substantially the same material as first gate insulation layer 242.

Second gate electrode 252 is formed on second gate insulation layer 250. Second gate electrode 252 comprises doped polysilicon, a metal and/or a metal silicide. In some embodiments, for example, second gate electrode 252 comprises titanium, titanium nitride, tantalum, tantalum nitride, tungsten, tungsten nitride, tungsten silicide, nickel silicide, or cobalt silicide. These materials may be used alone or in combination. Second gate electrode 252 can have a single layer or a multi-layered structure comprising a polysilicon layer, a metal layer, and/or a metal silicide layer.

Gate mask 254 is formed on second gate electrode 252, and gate spacer 256 is formed on sidewalls of gate mask 254 and second gate electrode 252. Gate mask 254 and gate spacer 256 each comprise a material having an etching selectivity relative to second active structure 233. For example, in some embodiments, gate mask 254 and gate spacer 256 each comprise a nitride such as silicon nitride or an oxynitride such as silicon oxynitride.

Third and fourth impurity regions 258 and 260 are formed at upper portions of second upper pattern 232 adjacent to second gate electrode 252. Third and fourth impurity regions 258 and 260 serve as source/drain regions. Third and fourth impurity regions 258 and 260 typically comprise the same type of impurities as first and second impurity regions 220a and 246.

A second insulating interlayer 262 covering first and second active structures 231 and 233 and the first and second transistors is formed on second field insulation layer pattern 240a. Second insulating interlayer 262 comprises an oxide such as silicon oxide. In some embodiments, for example, second insulating interlayer 262 comprises boro phosphor silicate glass (BPSG), phosphor silicate glass (PSG), spin on glass (SOG), undoped silicate glass (USG), flowable oxide (FOX), fluoride silicate glass (FSG), tetra ethyl ortho silicate (TEOS), plasma enhanced tetra ortho silicate (PE-TEOS), or high density plasma chemical vapor deposition (HDP-CVD) oxide. Second insulating interlayer 262 has a flat top surface.

A plurality of contact plugs 264, 266, 268 and 270 are formed through second insulating interlayer 262 and/or first insulating interlayer 248. First contact plug 264 is electrically connected to third and fourth impurity regions 258 and 260 in second region II. Second contact plug 266 is electrically connected to first gate electrode 244 in first region I. Third contact plug 268 is electrically connected to buried wiring 107a in first region I. Fourth contact plug 270 is electrically connected to a top surface of first upper pattern 230.

A capacitor 274 is electrically connected to second impurity region 246 via fourth contact plug 270. The capacitor comprises a lower electrode 272a, a dielectric layer 272b, and an upper electrode 272c. Lower electrode 272a has a cylindrical shape.

Buried wiring 107a serves as a bit line under first active structure 231. In certain embodiments, buried wiring 107a comprises first conductive layer pattern 106a and first barrier layer pattern 104a each comprising a metal, so it has a relatively low resistance.

Additionally, first and second active structures 231 and 233 are electrically isolated by first and second field insulation layer patterns 238 and 240a, respectively, and thus a p-n junction is prevented from being generated between well regions in the cell region or the peripheral circuit region. Accordingly, the semiconductor device has enhanced electrically characteristics and reliability.

FIGS. 10 through 22 are cross-sectional views illustrating a method of manufacturing the semiconductor device of FIGS. 8 and 9 according to an embodiment of the inventive concept. In the method of FIGS. 10 through 22, initial processes are performed substantially the same as those illustrated with reference to FIGS. 2 through 7 to form buried wiring type substrate 160 comprising insulation layer 108, conductive layer 106, barrier layer 104, and single crystalline semiconductor layer 100a sequentially stacked on support substrate 150.

Figure 10:
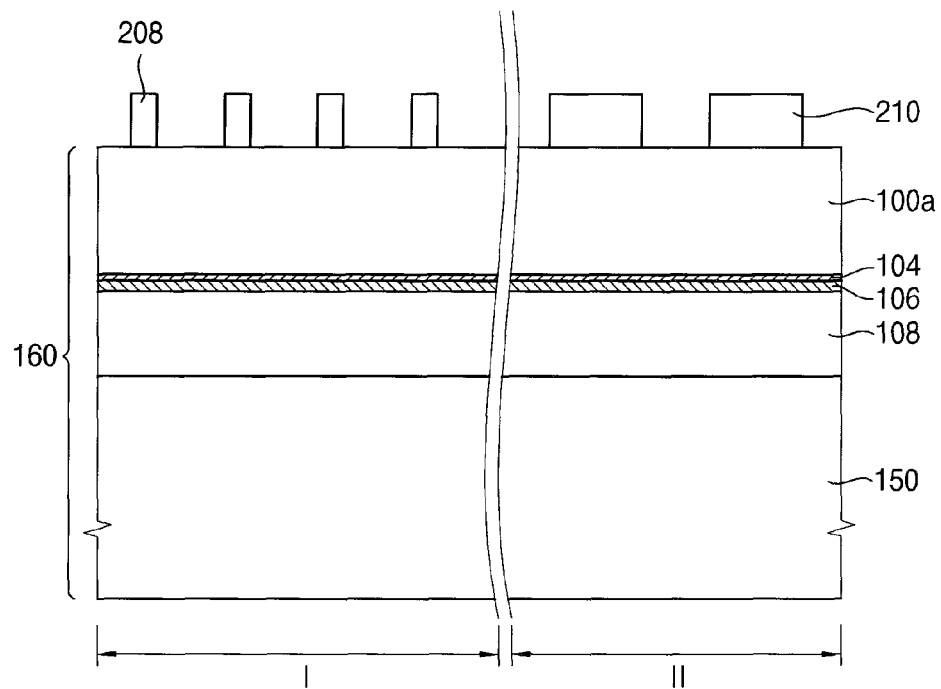
FIGS. 10 through 22 are cross-sectional views illustrating a method of manufacturing the semiconductor device of FIGS. 8 and 9 according to an embodiment of the inventive concept.

Referring to FIG. 10, first and second masks 208 and 210 are formed on single crystalline semiconductor layer 100a. First mask 208 extends in a first direction.

First and second masks 208 and 210 are formed using a material having an etching selectivity relative to single crystalline semiconductor layer 100a. For example, first and second masks 208 and 210 can be formed using an oxide, a nitride, or an oxynitride.

Figure 11:
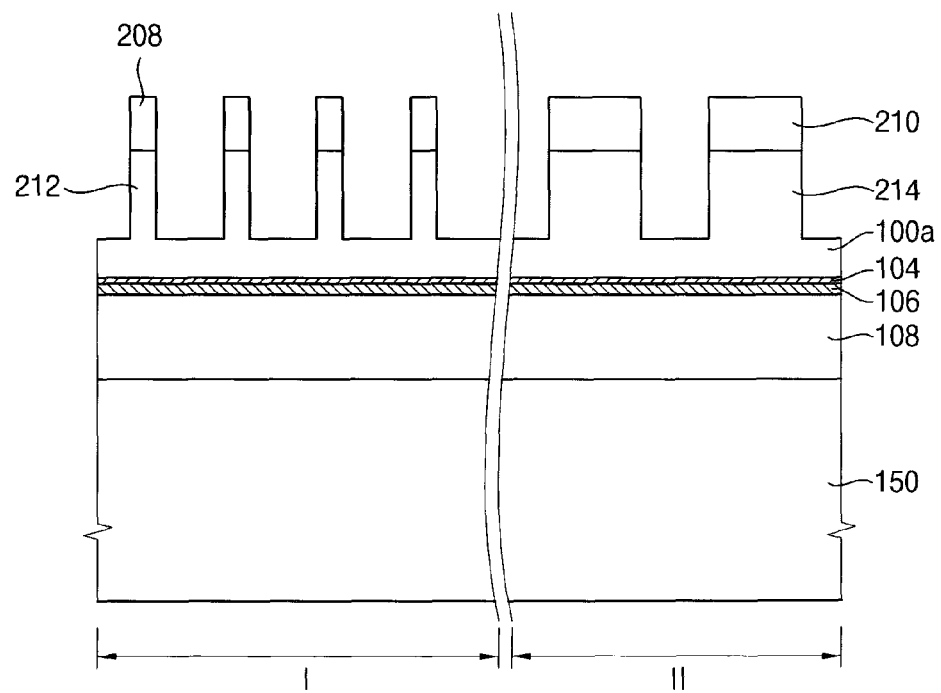

Referring to FIG. 11, single crystalline semiconductor layer 100a is partially removed using first and second masks 208 and 210 as an etching mask to form a preliminary first upper pattern 212 and a second upper pattern 214. In some embodiments, preliminary first upper pattern 212 is formed to extend in the first direction.

Figure 12:
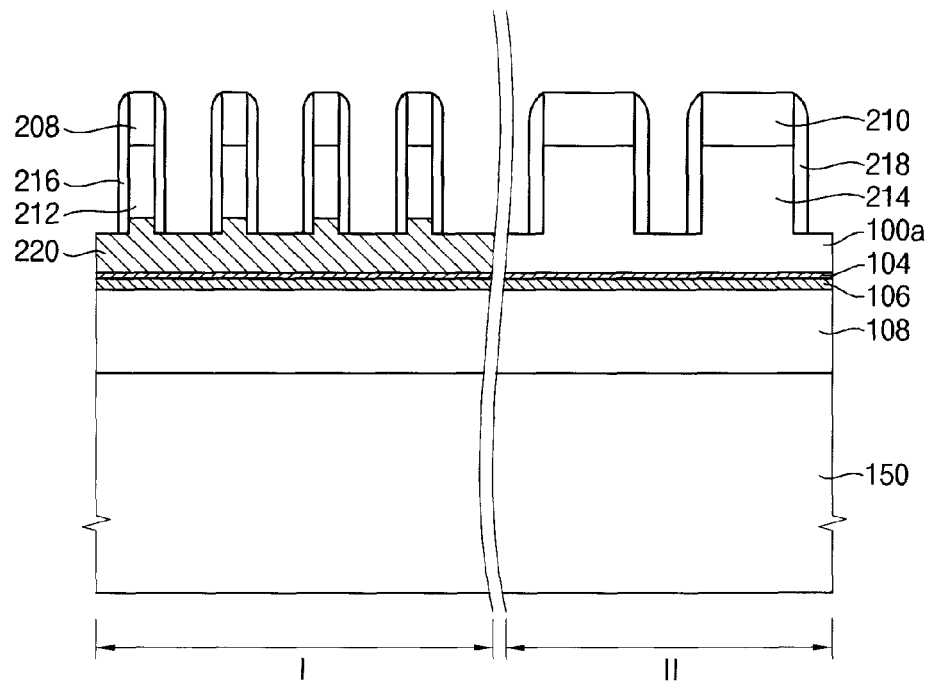

Referring to FIG. 12, a first spacer 216 is formed on sidewalls of first mask 208 and preliminary first upper pattern 212. A second spacer 218 is formed on sidewalls of second mask 210 and second upper pattern 214. In particular, a spacer layer is formed on first mask 208, preliminary first upper pattern 212, second mask 210, and second upper pattern 214. The spacer layer is formed using silicon oxide or silicon nitride. The spacer layer is anisotropically etched to form first and second spacers 216 and 218 exposing single crystalline semiconductor layer 100a.

First impurities are implanted into single crystalline semiconductor layer 100a using first mask 208 and first spacer 216 as an ion implantation mask to form a preliminary first impurity region 220 at portions of single crystalline semiconductor layer 100a that are not covered by first mask 208 and first spacer 216. However, the impurities diffuse so that preliminary first impurity region 220 is formed even at portions of single crystalline semiconductor layer 100a that are covered by first mask 208 and first spacer 216. The first impurities can be p-type impurities or n-type impurities.

In the ion implantation process, preliminary first impurity region 220 is formed to contact barrier layer 104 by controlling the location at which the first impurities are implanted.

Figure 13:
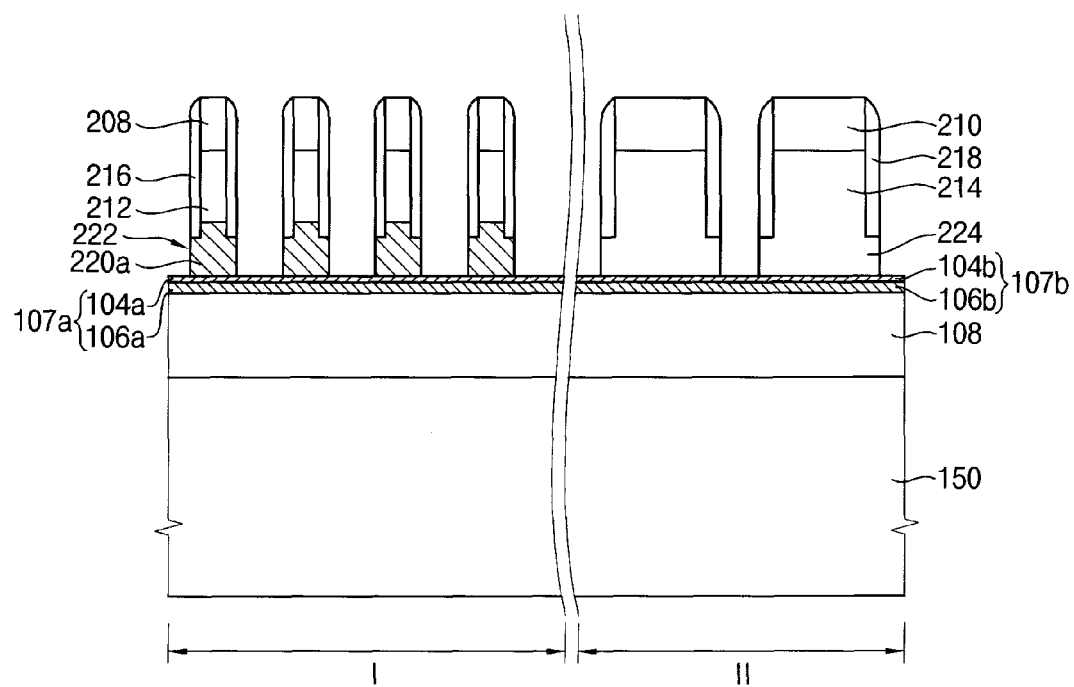

Referring to FIG. 13, single crystalline semiconductor layer 100a is etched using first mask 208, second mask 210, first spacer 216, and second spacer 218 as an etching mask to form a first lower pattern 222 and a second lower pattern 224. First lower pattern 222 is formed beneath preliminary first upper pattern 212, and second lower pattern 224 is formed beneath second upper pattern 214. In the etching process, preliminary first impurity region 220 is also etched to form first impurity region 220a in first lower pattern 222.

First impurity region 220a serves as a source/drain region of a first transistor subsequently formed. In some embodiments, first lower pattern 222 is formed to extend in the first direction, and second lower pattern 224 is formed to have an island shape.

Figure 14:
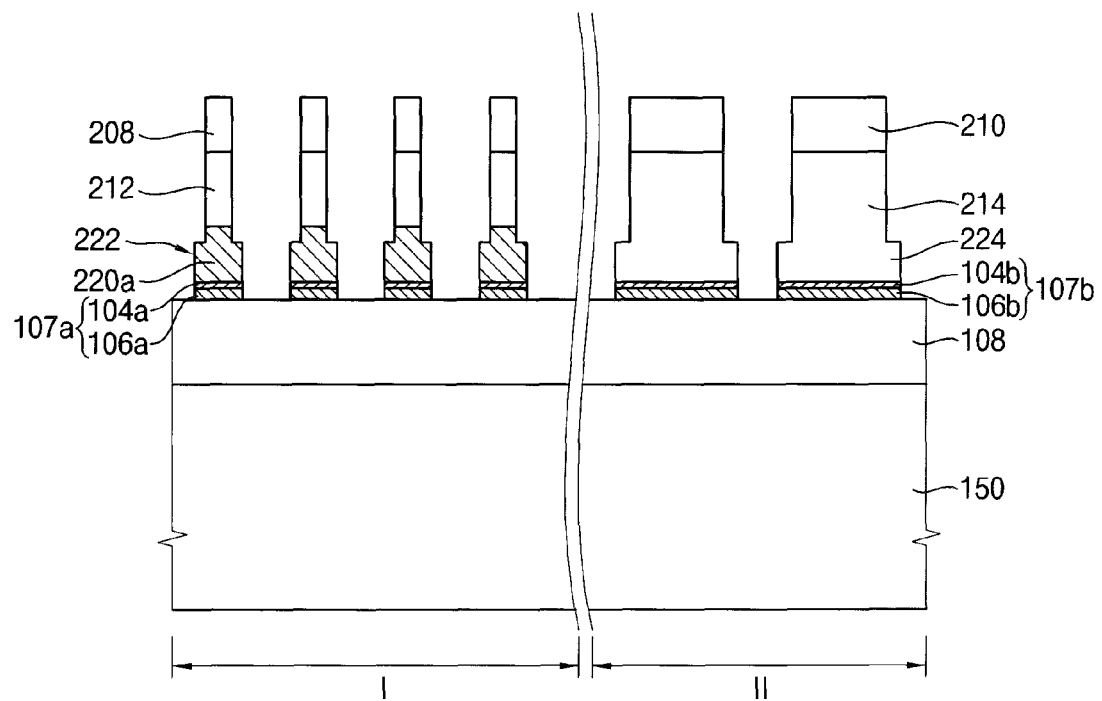

Referring to FIG. 14, barrier layer 104 and conductive layer 106 are partially etched to form buried wiring 107a and conductive structure 107b. Buried wiring 107a is formed between first lower pattern 222 and insulation layer 108 in first region I, and conductive structure 107b is formed between second lower pattern 224 and insulation layer 108 in second region II. Buried wiring 107a comprises first conductive layer pattern 106a and first barrier layer pattern 104a, which are sequentially stacked, and conductive structure 107b comprises second conductive layer pattern 106b and second barrier layer pattern 104b, which are sequentially stacked.

In some embodiments, buried wiring 107a has a width that is substantially the same as that of first lower pattern 222 and extends in the first direction. Buried wiring 107a serves as a bit line and is electrically connected to first impurity region 220a. Conductive structure 107b has a width that is substantially the same as that of second lower pattern 224.

Buried wiring 107a comprises first barrier layer pattern 104a to facilitate good adhesion to first conductive layer pattern 106a and to prevent a metal of first conductive layer pattern 106a from diffusing. Additionally, first conductive layer pattern 106a comprises a metal having a low resistance to provide buried wiring 107a with a low resistance.

Figure 15:
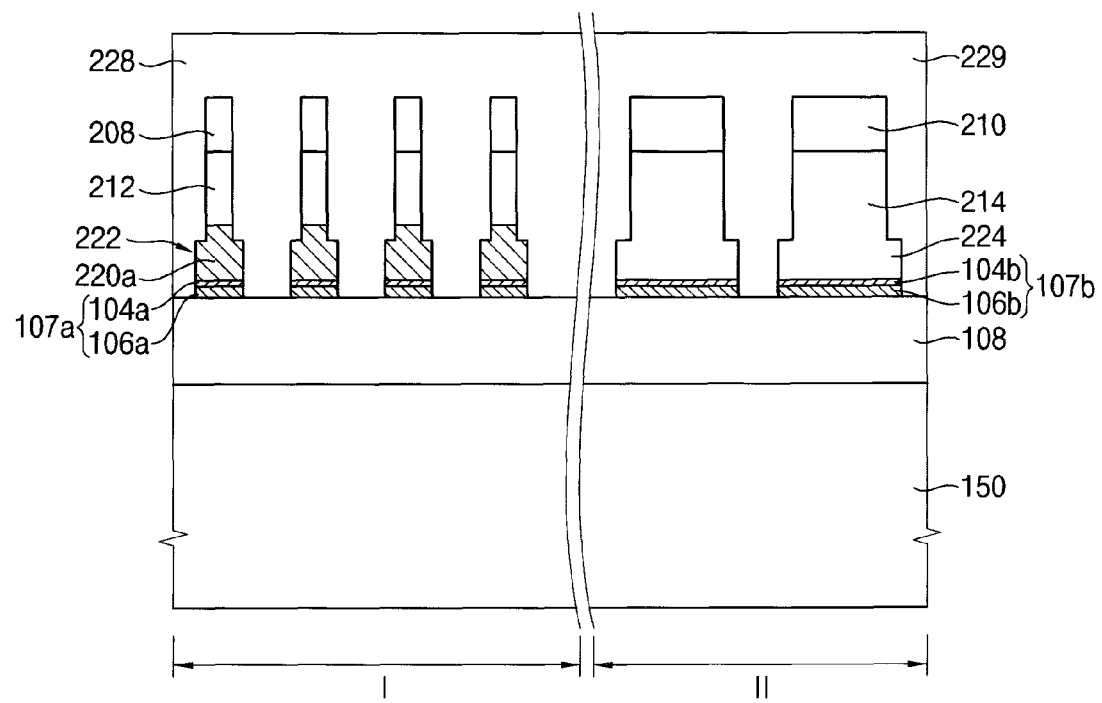

Referring to FIG. 15, a third mask 228 is formed on insulation layer 108 in first region I to partially cover first mask 208, preliminary first upper pattern 212, first lower pattern 222, and buried wiring 107a. A fourth mask 229 is formed on insulation layer 108 in second region II to cover second mask 210, second upper pattern 214, second lower pattern 224, and conductive structure 107b. In some embodiments, third mask 228 has a linear shape that extends in a second direction perpendicular to the first direction. Third and fourth masks 228 and 229 typically comprise a photoresist pattern.

Figure 16:
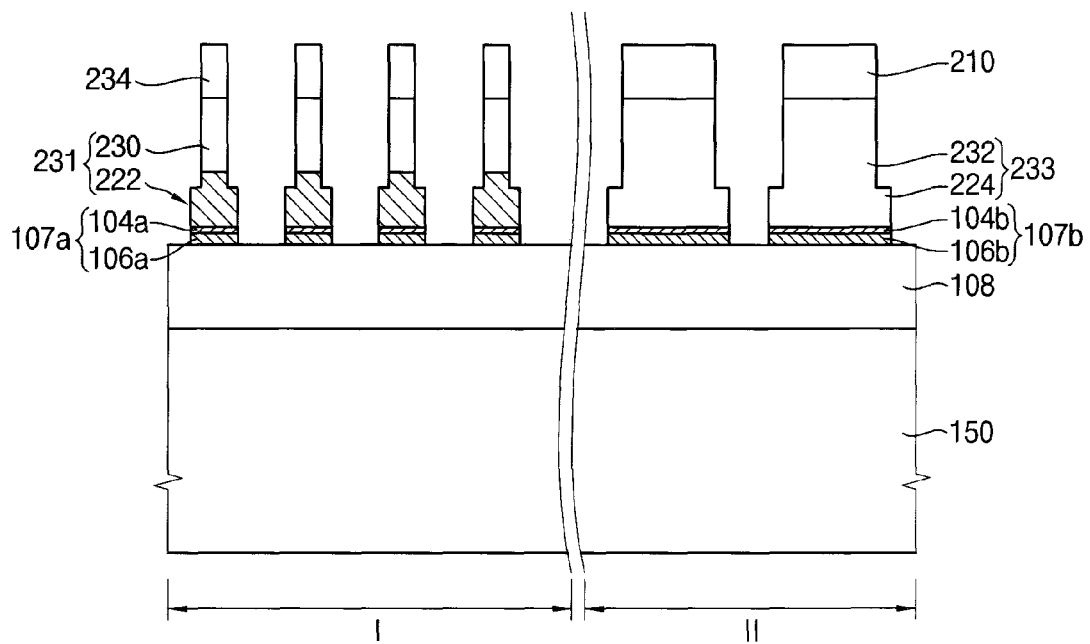

Referring to FIG. 16, first mask 208 is etched using third and fourth masks 228 and 229 as an etching mask to form a fifth mask 234 having a pillar shape, such as a cylinder or a canted column.

Preliminary first upper pattern 212 is etched using fifth mask 234 to form first upper pattern 230 having a pillar shape. In some embodiments, a plurality of first upper patterns 230 is formed on first lower pattern 222 extending in the first direction.

By the above processes, first active structure 231 including first upper pattern 230 and first lower pattern 222 is formed on first barrier layer pattern 104a in first region I, and a second active structure 233 including second upper pattern 232 and second lower pattern 224 is formed on second barrier layer pattern 104b in second region II.

As indicated by the foregoing, first lower pattern 222 is formed to have a first width larger than a second width of first upper pattern 230, and second lower pattern 224 is formed to have a third width larger than a fourth width of second upper pattern 232. The third width of second lower pattern 224 is larger than the first width of first lower pattern 222. Thus, first and second active structures 231 and 233 have a step structure.

Figure 17:
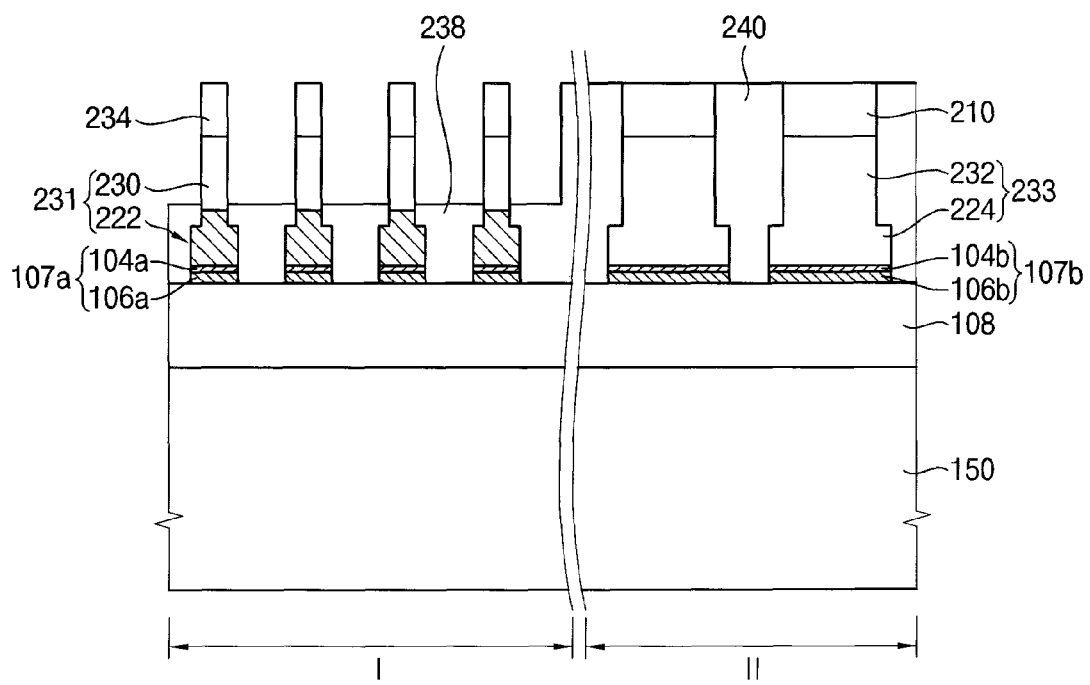

Referring to FIG. 17, first field insulation layer pattern 238 and a preliminary second field insulation layer pattern 240 are formed on insulation layer 108 in first and second regions I and II, respectively.

First field insulation layer pattern 238 partially fills spaces between first active structures 231 in first region I. In some embodiments, first field insulation layer pattern 238 fills spaces between first lower patterns 222 and spaces between lower portions of first upper patterns 230. Thus, first impurity region 220a is covered by first field insulation layer pattern 238, and first field insulation layer pattern 238 has a top surface that is higher than that of first lower pattern 222 and lower than that of first upper pattern 230. Accordingly, first upper pattern 230 protrudes from first field insulation layer pattern 238.

Preliminary second field insulation layer pattern 240 fills spaces between second active structures 233, but it does not cover a top surface of second mask 210. Preliminary second field insulation layer pattern 240 has a top surface that is coplanar with the top surface of second mask 210. Alternatively, preliminary second field insulation layer pattern 240 can be formed with a top surface that is coplanar with a top surface of second active structure 233. In this case, second mask 210 protrudes from preliminary second field insulation layer pattern 240.

First field insulation layer pattern 238 and preliminary second field insulation layer pattern 240 are formed as follows. A field insulation layer is formed on insulation layer 108 to cover fifth mask 234, first active structure 231, buried wiring 107a, second mask 210, second active structure 233, and conductive structure 107b. The field insulation layer is formed using an oxide such as silicon oxide. For example, the field insulation layer can be formed using BPSG, PSG, SOG, USG, FOX, FSG, TEOS, PE-TEOS, or HDP-CVD oxide. The field insulation layer is partially removed until a top surface of fifth and second masks 234 and 210 are exposed to form preliminary second field insulation layer pattern 240 in second region II. The field insulation layer in first region I is further removed to form first field insulation layer pattern 238 partially exposing first upper pattern 230.

Figure 18:
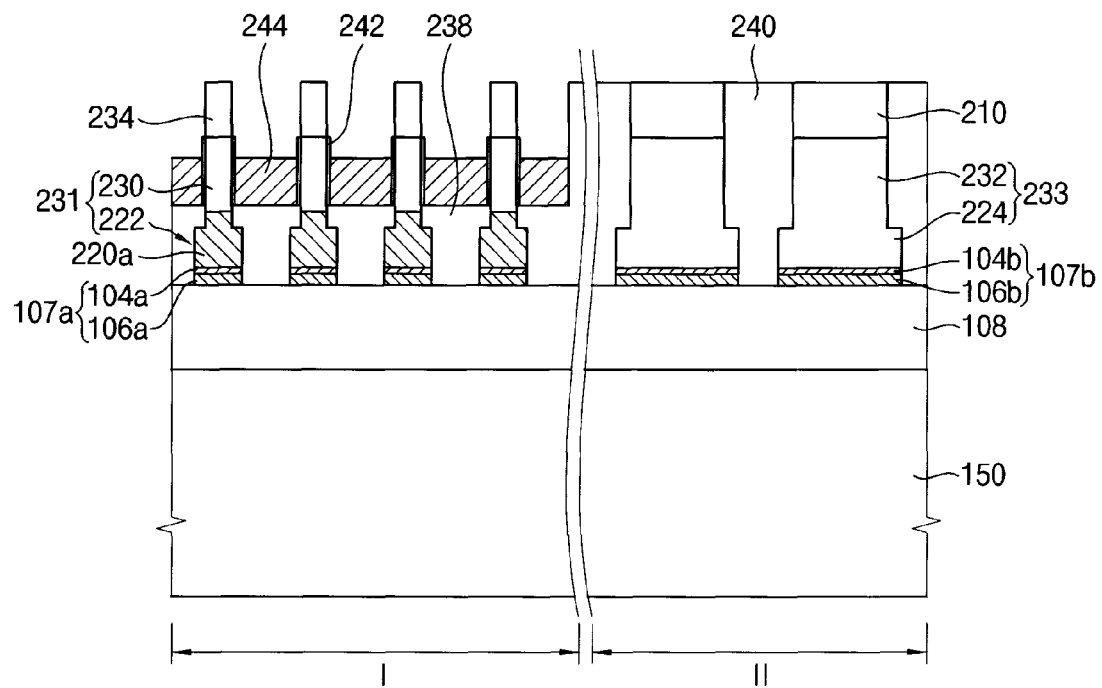

Referring to FIG. 18, first gate insulation layer 242 is formed on a sidewall of first upper pattern 230 exposed by first field insulation layer pattern 238. First gate insulation layer 242 insulates first upper pattern 230 from first gate electrode 244 that is formed subsequently. In some embodiments, first gate insulation layer 242 surrounds sidewalls of first upper pattern 230.

First gate insulation layer 242 is typically formed using silicon oxide or a metal oxide. For example, first gate insulation layer 242 can be formed using aluminum oxide, hafnium oxide, or zirconium oxide. First gate insulation layer 242 is typically formed by a thermal oxidation process, a chemical vapor deposition (CVD) process, an atomic layer deposition (ALD) process, or a sputtering process.

A second conductive layer is formed on first field insulation layer pattern 238, preliminary second field insulation layer pattern 240, and second mask 210 to cover first gate insulation layer 242 and first active structure 231. The second conductive layer is formed using doped polysilicon, a metal, and/or a metal silicide. For example, the second conductive layer can be formed using titanium, titanium nitride, tantalum, tantalum nitride, tungsten, tungsten nitride, tungsten silicide, nickel silicide, or cobalt silicide. These materials can be used alone or in combination. An upper portion of the second conductive layer is removed to expose fifth mask 234 and top surfaces of preliminary second field insulation layer pattern 240 and second mask 210.

A sixth mask (not shown) having a linear shape extending in the second direction is formed on the second conductive layer. The second conductive layer is etched using the sixth mask as an etching mask to form first gate electrode 244 on first field insulation layer pattern 238. First gate electrode 244 has a linear shape extending in the second direction. First gate electrode 244 surrounds the sidewall of first upper pattern 230. In some embodiments, first gate electrode 244 is formed with a top surface lower than that of first upper pattern 230, and thus first upper pattern 230 is exposed by first gate electrode 244.

Figure 19:
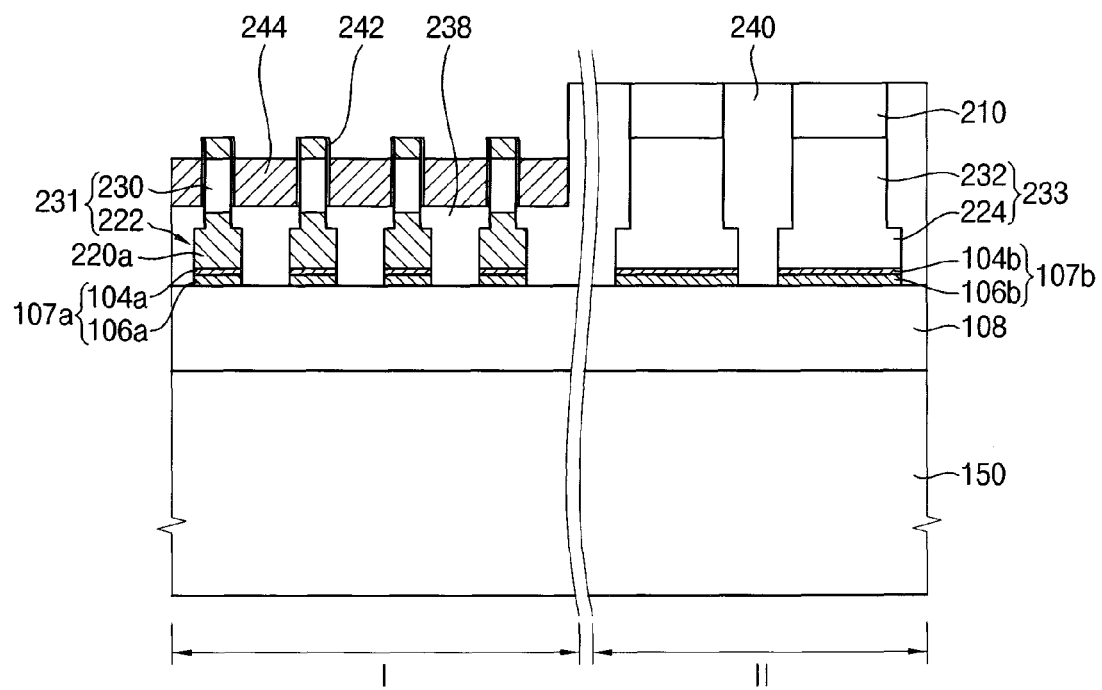
Figure 23:
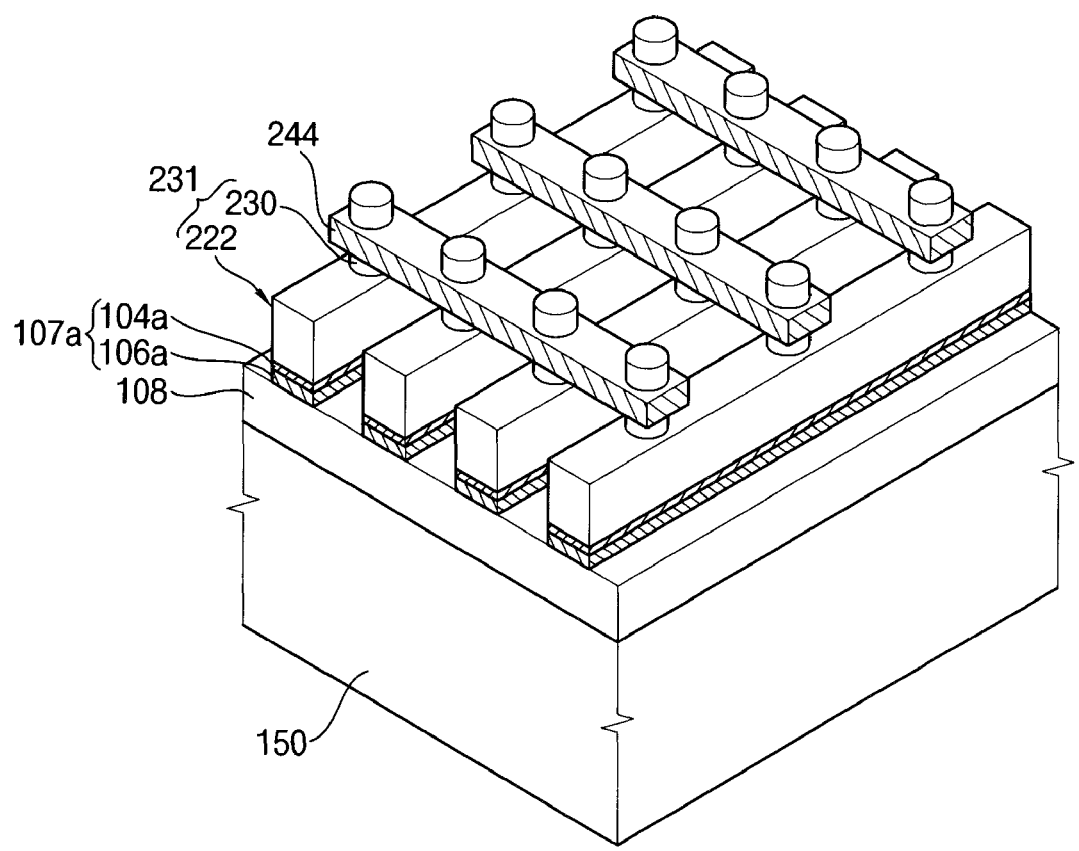
FIG. 23 is a perspective view illustrating a method of manufacturing the semiconductor device of FIGS. 8 and 9 according to an embodiment of the inventive concept.

Referring to FIG. 19, fifth mask 234 is removed to expose a top surface of first upper pattern 230 in first region I. Thus, a structure shown in FIG. 23 is formed in first region I.

Second impurities are implanted into an upper portion of first upper pattern 230 that is not covered by first gate electrode 244 to form second impurity region 246. Second impurity region 246 serves as a source/drain region of the first transistor. The second impurities of second impurity region 246 are substantially the same as those of first impurity region 220a.

By forming second impurity region 246, first active structure 231 and the first transistor are formed in first region I. The first transistor comprises first gate insulation layer 242, first gate electrode 244, first impurity region 220a, and second impurity region 246. The first transistor has a vertical channel in a third direction perpendicular to top surface B2 of support substrate 150. First impurity region 220a is electrically connected to buried wiring 107a.

Figure 20:
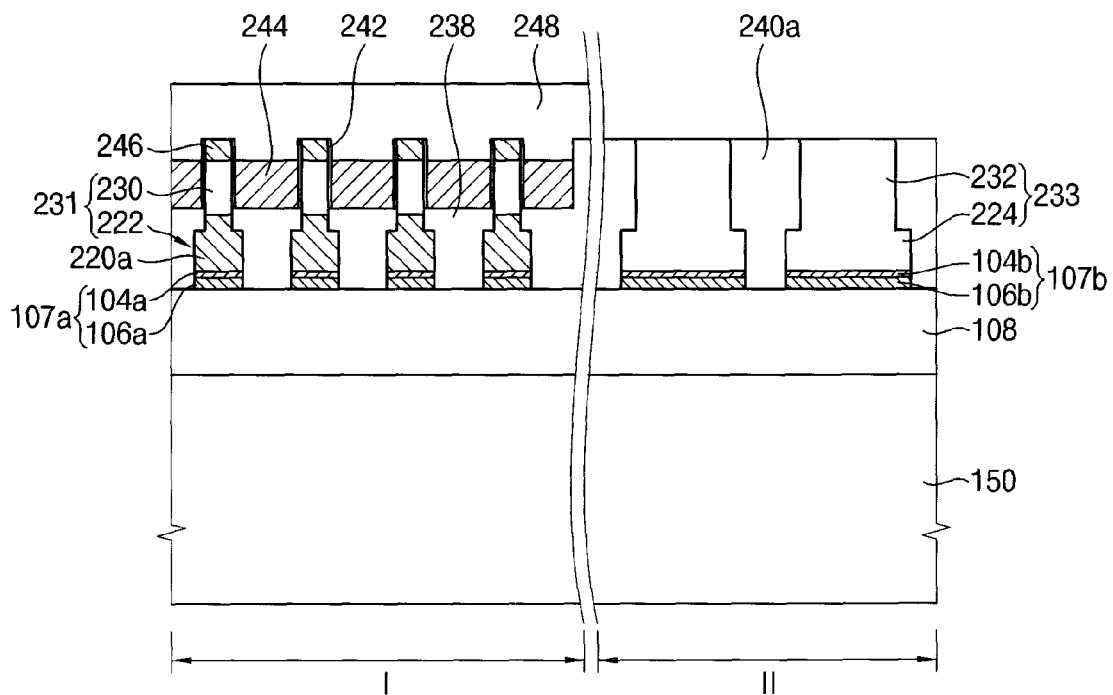

Referring to FIG. 20, first insulating interlayer 248 is formed on first field insulation layer pattern 238, preliminary second field insulation layer pattern 240 and second mask 210 to cover first gate electrode 244, first gate insulation layer 242, and second impurity region 246. An upper portion of first insulating interlayer 248 is planarized to expose a top surface of second mask 210.

Second mask 210 is removed, and simultaneously preliminary second field insulation layer pattern 240 is partially removed to form second field insulation layer pattern 240a. Thus, a top surface of second upper pattern 232 is exposed.

Figure 21:
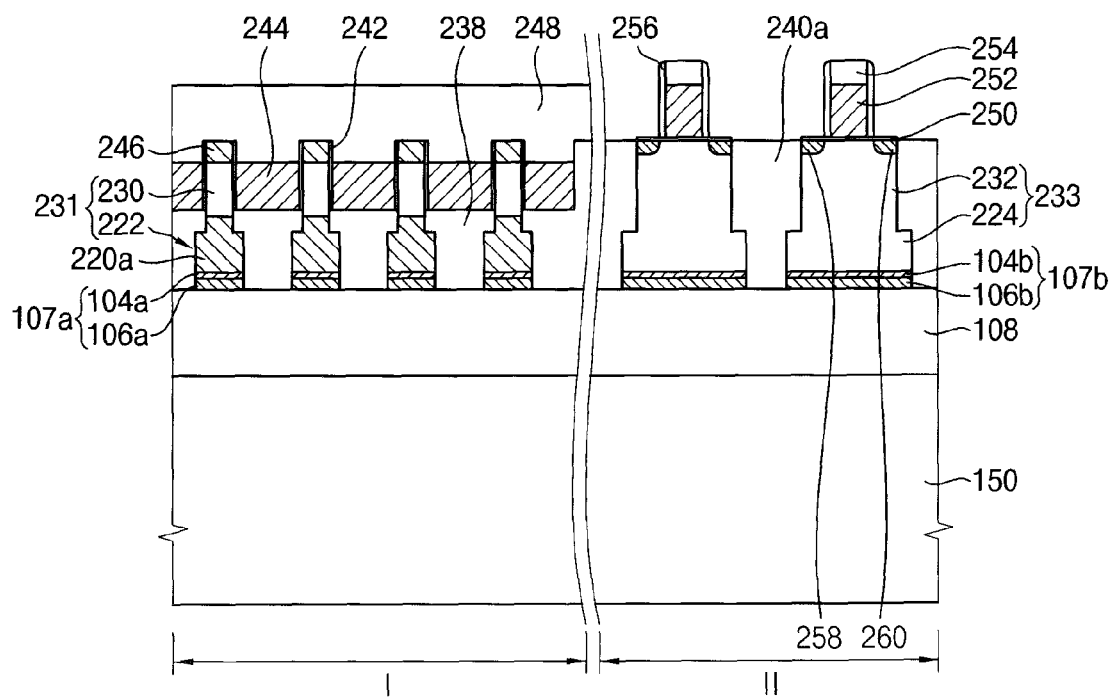

Referring to FIG. 21, second gate insulation layer 250 is formed on the top surface of second upper pattern 232. Second gate insulation layer 250 is typically formed using silicon oxide or a metal oxide. Second gate insulation layer 250 is typically formed using a thermal oxidation process, a CVD process, an ALD process, or a sputtering process. Second gate insulation layer 250 is formed using substantially the same material as first gate insulation layer 242.

A third conductive layer is formed on second gate insulation layer 250. The third conductive layer is typically formed using doped polysilicon, a metal, and/or a metal silicide. For example, the third conductive layer can be formed using titanium, titanium nitride, tantalum, tantalum nitride, tungsten, tungsten nitride, tungsten silicide, nickel silicide, or cobalt silicide. These materials can be used alone or in combination.

Gate mask 254 is formed on the third conductive layer, and the third conductive layer is patterned using the gate mask as an etching mask to form second gate electrode 252. In some embodiments, second gate electrode 252 is formed to extend in the first direction. Gate mask 254 is formed using a material having an etching selectivity relative to second field insulation layer pattern 240a and second active structure 233. For example, gate mask 254 can be formed of silicon nitride or silicon oxynitride.

Gate spacer 256 is formed on sidewalls of gate mask 254 and second gate electrode 252. Gate spacer 256 is typically formed using a nitride such as silicon nitride or an oxynitride such as silicon oxynitride.

Third impurities are implanted into second upper pattern 232 using second gate electrode 252 and gate spacer 256 as an ion implantation mask to form third and fourth impurity regions 258 and 260 adjacent to second gate electrode 252. Thus, a second transistor including second gate insulation layer 250, second gate electrode 252, and third and fourth impurity regions 258 and 260 is formed in second region II.

Where a p-type well region (not shown) is formed in second active structure 233, the third impurities can be n-type impurities, and the second transistor can be an NMOS transistor. Where an n-type well region (not shown) is formed in second active structure 233, the third impurities can be p-type impurities, and the second transistor can be a PMOS transistor.

Figure 22:
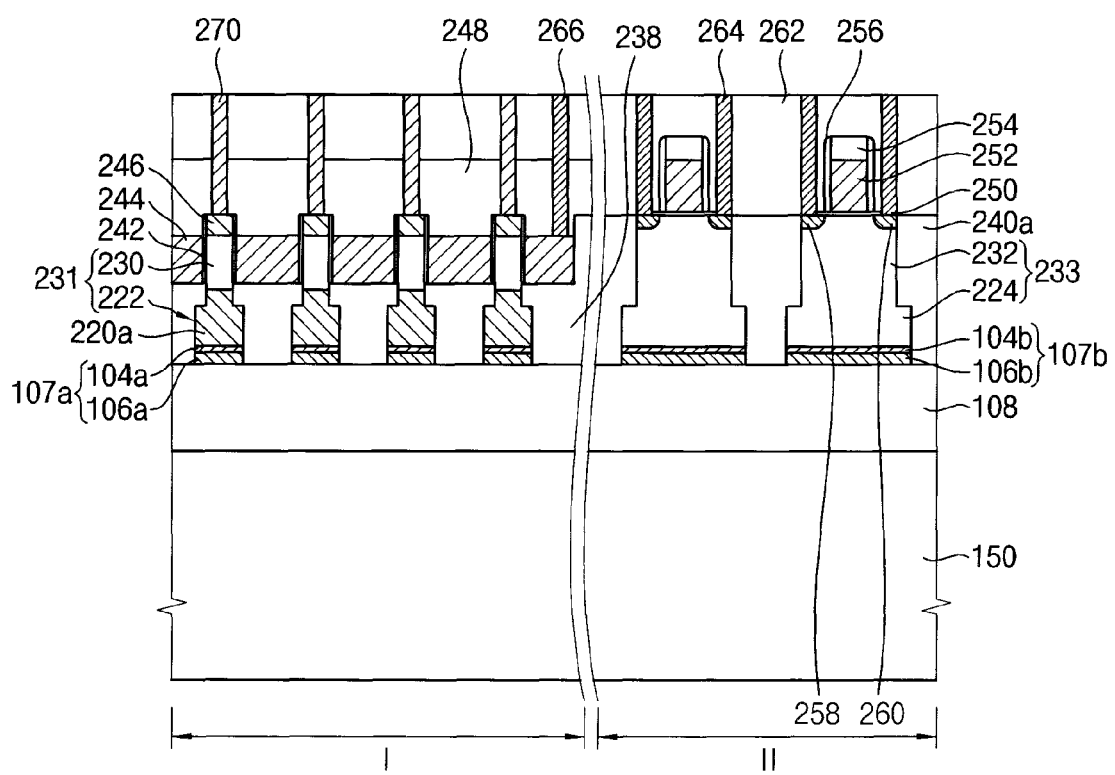

Referring to FIG. 22, second insulating interlayer 262 is formed on first insulating interlayer 248, second field insulation layer pattern 240a, and second active structure 233 to cover the second transistor. Second insulating interlayer 262 is typically formed using an oxide such as silicon oxide. For example, second insulating interlayer 262 can be formed using BPSG, PSG, SOG, USG, FOX, FSG, TEOS, PE-TEOS, or HDP-CVD oxide. Second insulating interlayer 262 is generally formed using substantially the same material as first and second field insulation layer patterns 238 and 240a.

After an upper portion of second insulating interlayer 262 is planarized, first contact holes (not shown) are formed through second insulating interlayer 262. The planarization process is typically performed by a chemical mechanical polishing (CMP) process and/or an etch back process. The first contact holes expose third and fourth impurity regions 258 and 260.

A second contact hole (not shown) is formed through first and second insulating interlayers 248 and 262 to expose a top surface of first gate electrode 244.

A third contact hole (not shown) is formed through first and second insulating interlayers 248 and 262 and first lower pattern 222 to expose first impurity region 220a and buried wiring 107a.

A fourth contact hole (not shown) is formed through first and second insulating interlayers 248 and 262 to expose a top surface of first upper pattern 230.

First and second active structures 231 and 233 have a small enough thickness to allow the contact holes to be readily formed.

A fourth conductive layer is formed on second insulating interlayer 262 to fill the contact holes. The fourth conductive layer is generally formed using doped polysilicon, a metal, and/or a metal silicide. For example, the fourth conductive layer can be formed using titanium, titanium nitride, tantalum, tantalum nitride, tungsten, tungsten nitride, tungsten silicide, nickel silicide, or cobalt silicide. These materials can be used alone or in combination.

An upper portion of the fourth conductive layer is removed until a top surface of second insulating interlayer 262 is exposed to form first, second, third, and fourth contact plugs 264, 266, 268, and 270 filling the first through fourth contact holes, respectively.

Referring again to FIGS. 8 and 9, capacitor 274 is formed to be electrically connected to second impurity region 246 via fourth contact plug 270. Capacitor 274 is formed with lower electrode 272a, dielectric layer 272b, and upper electrode 272c. In some embodiments, lower electrode 272a has a cylindrical shape.

Buried wiring 107a serves as a bit line under first active structure 231, providing a low resistance and highly integrated structure. More particularly, buried wiring 107a comprises first conductive layer pattern 106a and first barrier layer pattern 104a including a metal, providing a relatively low resistance.

Additionally, first and second active structures 231 and 233 are electrically isolated by first and second field insulation layer patterns 238 and 240a, respectively, and thus a p-n junction is prevented from being generated between well regions in the cell region or the peripheral circuit region. Accordingly, the semiconductor device has enhanced electrically characteristics and reliability compared with other some semiconductor devices.

Figure 24:
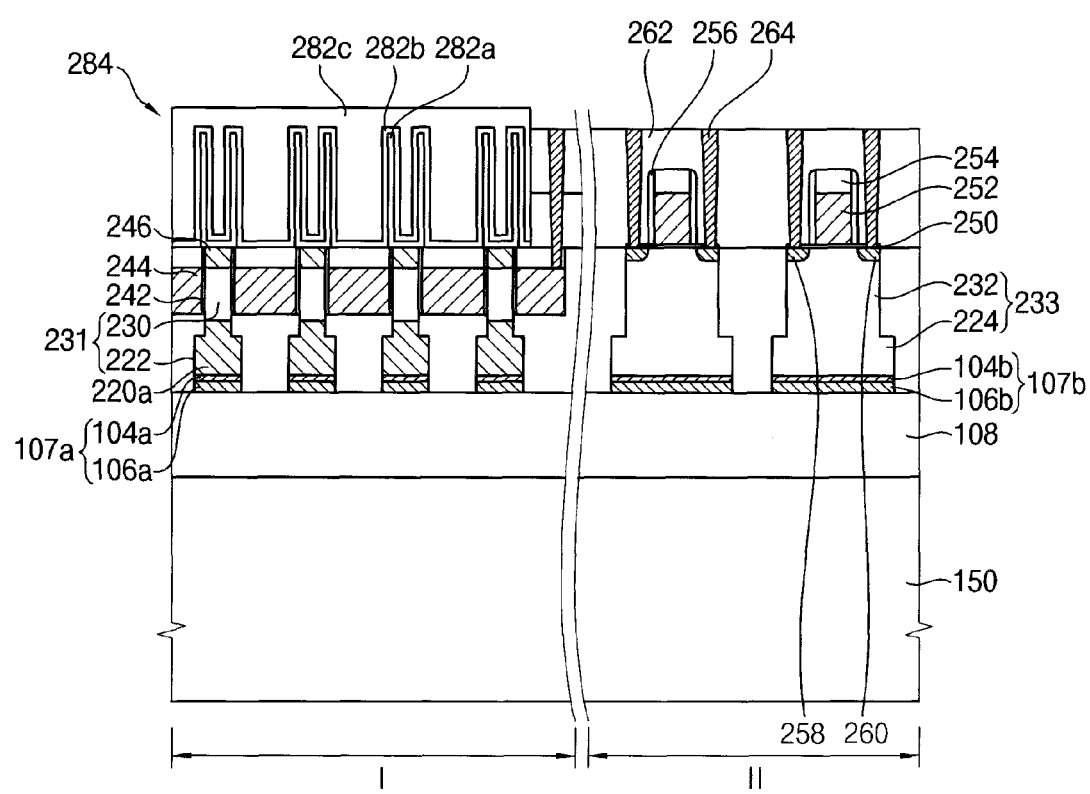
FIGS. 24 and 25 are cross-sectional views illustrating a semiconductor device in accordance with another embodiment of the inventive concept.
Figure 25:
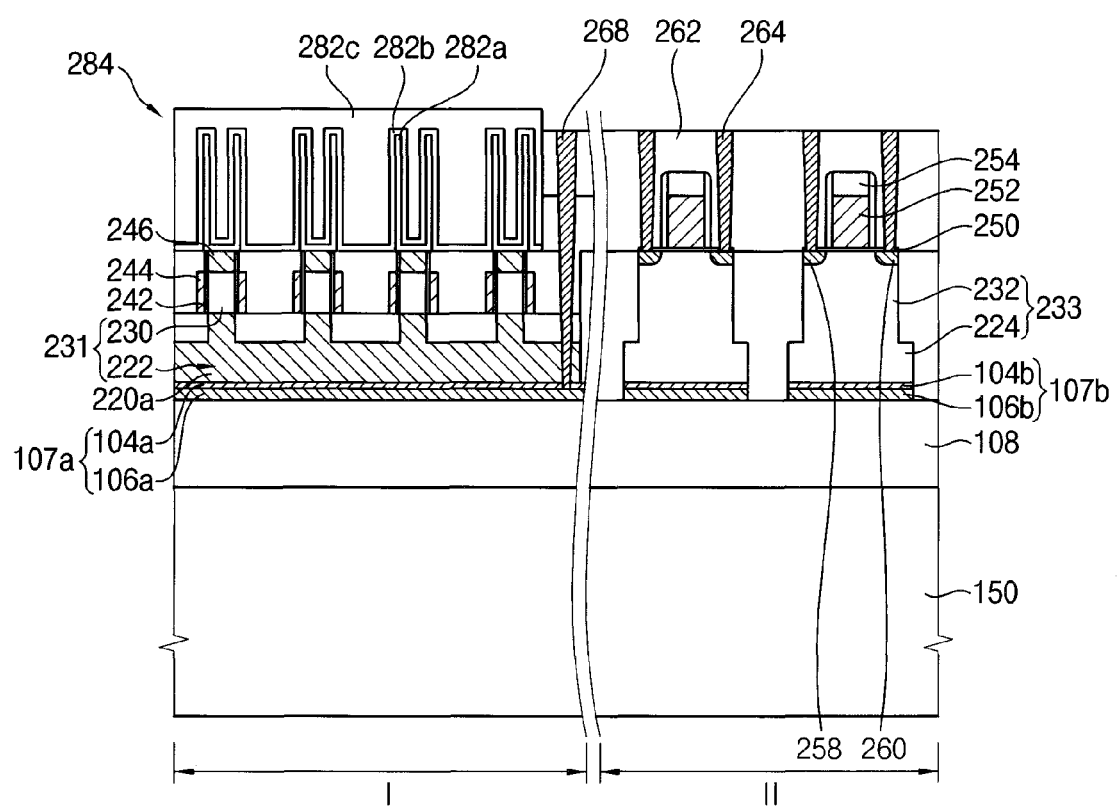

FIGS. 24 and 25 are cross-sectional views illustrating a semiconductor device in accordance with another embodiment of the inventive concept. The semiconductor device is substantially the same as that illustrated in FIGS. 8 and 9, except that the capacitor makes direct contact with a top surface of the first active structure.

Referring to FIGS. 24 and 25, a capacitor 284 comprises a lower electrode 282a, a dielectric layer 282b and an upper electrode 282c. Capacitor 284 makes direct contact with a top surface of first active structure 231 with no contact plug. Thus, the semiconductor device has a reduced height.

Figure 26:
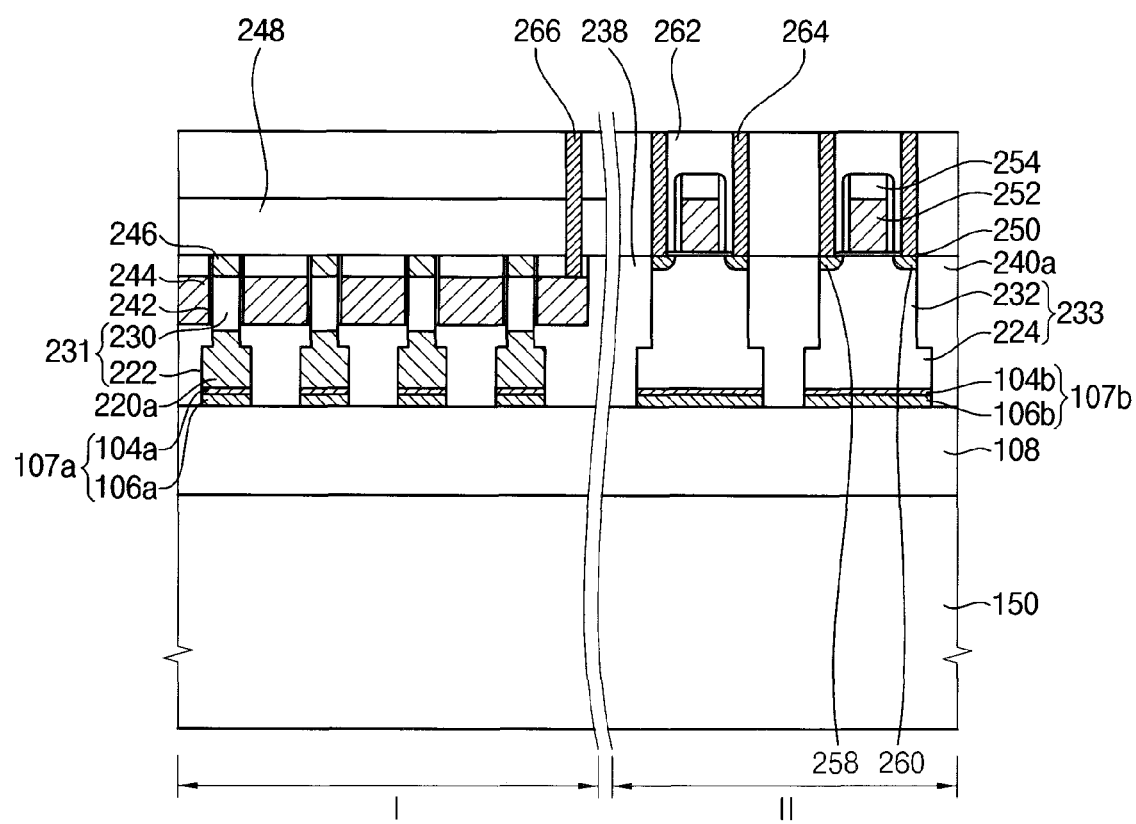
FIG. 26 is a cross-sectional view illustrating a method of manufacturing the semiconductor device of FIGS. 24 and 25 according to an embodiment of the inventive concept.

FIG. 26 is a cross-sectional view illustrating a method of manufacturing the semiconductor device of FIGS. 24 and 25. In the method of FIG. 26, initial processes are performed as illustrated in FIGS. 10 through 21 to form the structure shown in FIG. 21.

Referring to FIG. 26, second insulating interlayer 262 is formed on first insulating interlayer 248, second field insulation layer pattern 240a, and second active structure 233 to cover the second transistor. Second insulating interlayer 262 is formed using an oxide such as silicon oxide.

After an upper portion of second insulating interlayer 262 is planarized, first contact holes (not shown) are formed through second insulating interlayer 262. The first contact holes expose third and fourth impurity regions 258 and 260.

A second contact hole (not shown) is formed through first and second insulating interlayers 248 and 262 to expose a top surface of first gate electrode 244.

A third contact hole (not shown) is formed through first and second insulating interlayers 248 and 262 and first lower pattern 222 to expose first impurity region 220a and buried wiring 107a.

A fourth conductive layer is formed on second insulating interlayer 262 to fill the contact holes. An upper portion of the fourth conductive layer is removed until a top surface of second insulating interlayer 262 is exposed to form first, second, and third contact plugs 264, 266, and 268 filling the first through third contact holes, respectively.

Referring again to FIGS. 24 and 25, capacitor 284 is formed in electrical connection with second impurity region 246. Capacitor 284 is formed with lower electrode 282a, dielectric layer 282b and, upper electrode 282c. In some embodiments, lower electrode 282a has a cylindrical shape.

Figure 27:
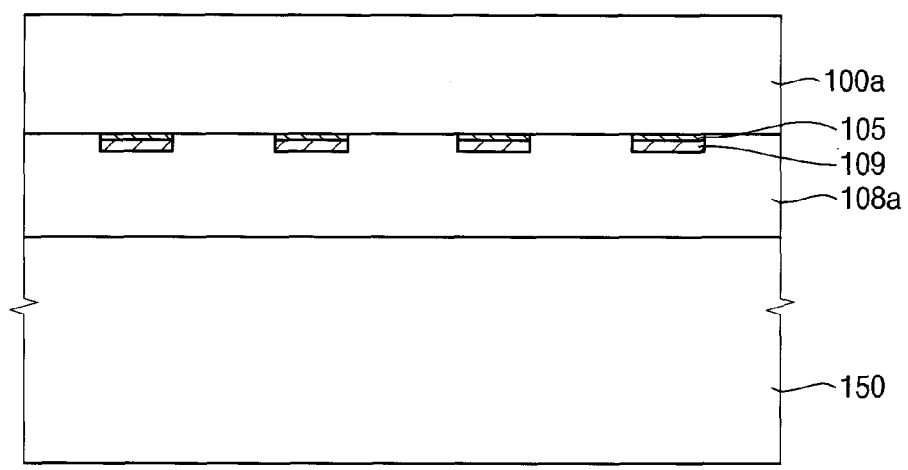
FIG. 27 is a cross-sectional view illustrating a buried wiring type substrate according to another embodiment of the inventive concept.

FIG. 27 is a cross-sectional view illustrating a buried wiring type substrate in accordance with other another embodiment of the inventive concept. The buried wiring type substrate of FIG. 27 is substantially the same as that of FIG. 1, except that the buried wiring is patterned.

Referring to FIG. 27, support substrate 150 is provided, and an insulation layer 108a is formed on support substrate 150. Insulation layer 108a comprises silicon oxide. A first surface of insulation layer 108a bonded to support substrate 150 is flat. A conductive layer pattern 109 and a barrier layer pattern 105 are formed on insulation layer 108a. Particularly, conductive layer pattern 109 and barrier layer pattern 105 are formed in a groove at an upper portion of insulation layer 108a.

A buried wiring type substrate 160 comprises support substrate 150, single crystalline semiconductor layer 100a, and conductive layer pattern 109 interposed therebetween.

Single crystalline semiconductor layer 100a comprises single crystalline silicon. Single crystalline semiconductor layer 100a has a thickness below about 1 µm, such as a thickness in a range of about 1,000 to about 6,000 Å. Single crystalline semiconductor layer 100a has a flat top surface. Single crystalline semiconductor layer 100a has a relatively small thickness and an even top surface to allow the formation of semiconductor devices thereon.

FIGS. 28 through 31 are cross-sectional views illustrating a method of manufacturing the buried wiring type substrate of FIG. 27. In the method of FIGS. 28 through 31, initial processes are performed substantially the same as those illustrated with reference to FIGS. 2 and 3 to form hydrogen ion implantation region 102 in donor substrate 100. Barrier layer 104 and conductive layer 106 are then sequentially formed on first surface S1 of donor substrate 100.

Figure 28:
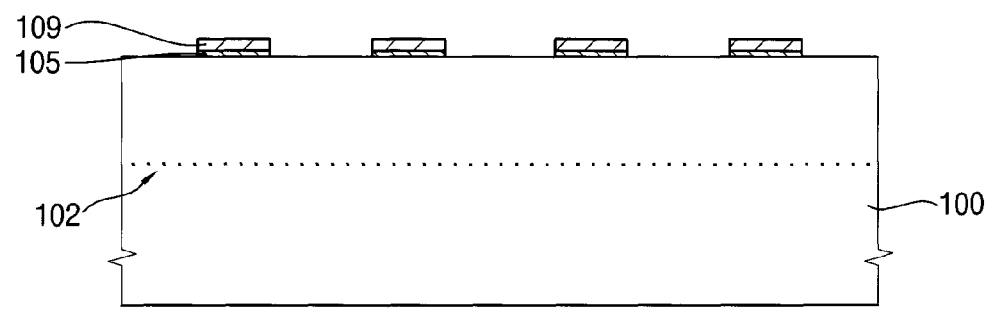
FIGS. 28 through 31 are cross-sectional views illustrating a method of manufacturing the buried wiring type substrate of FIG. 27 according to an embodiment of the inventive concept.

Referring to FIG. 28, conductive layer 106 and barrier layer 104 are patterned by a photolithography process to form conductive layer pattern 109 and barrier layer pattern 105, respectively. Barrier layer pattern 105 and conductive layer pattern 109 are patterned to have a linear shape or a pad shape.

Figure 29:
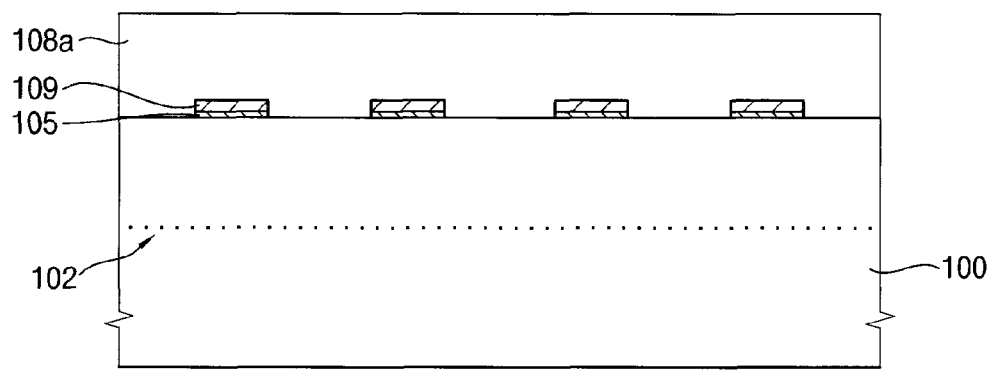

Referring to FIG. 29, insulation layer 108a is formed on donor substrate 100 using silicon oxide to cover conductive layer pattern 109 and barrier layer pattern 105. Insulation layer 108a is formed at a temperature below about 400° C.

After insulation layer 108a is formed, a planarization process is performed on an upper portion of insulation layer 108a. The planarization process typically comprises a CMP process and/or an etch back process.

By the above processes, barrier layer pattern 105, conductive layer pattern 109, and insulation layer pattern 108a are formed on donor substrate 100.

Figure 30:
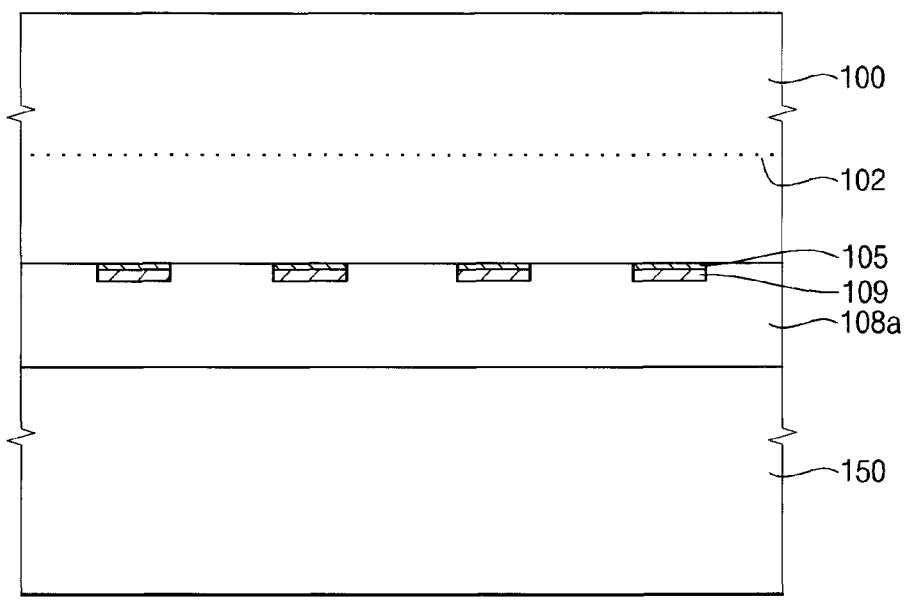

Referring to FIG. 30, support substrate 150 is prepared. Then, processes substantially the same as those illustrated with reference to FIGS. 5 and 6 are performed to bond insulation layer 108 to support substrate 150.

Figure 31:
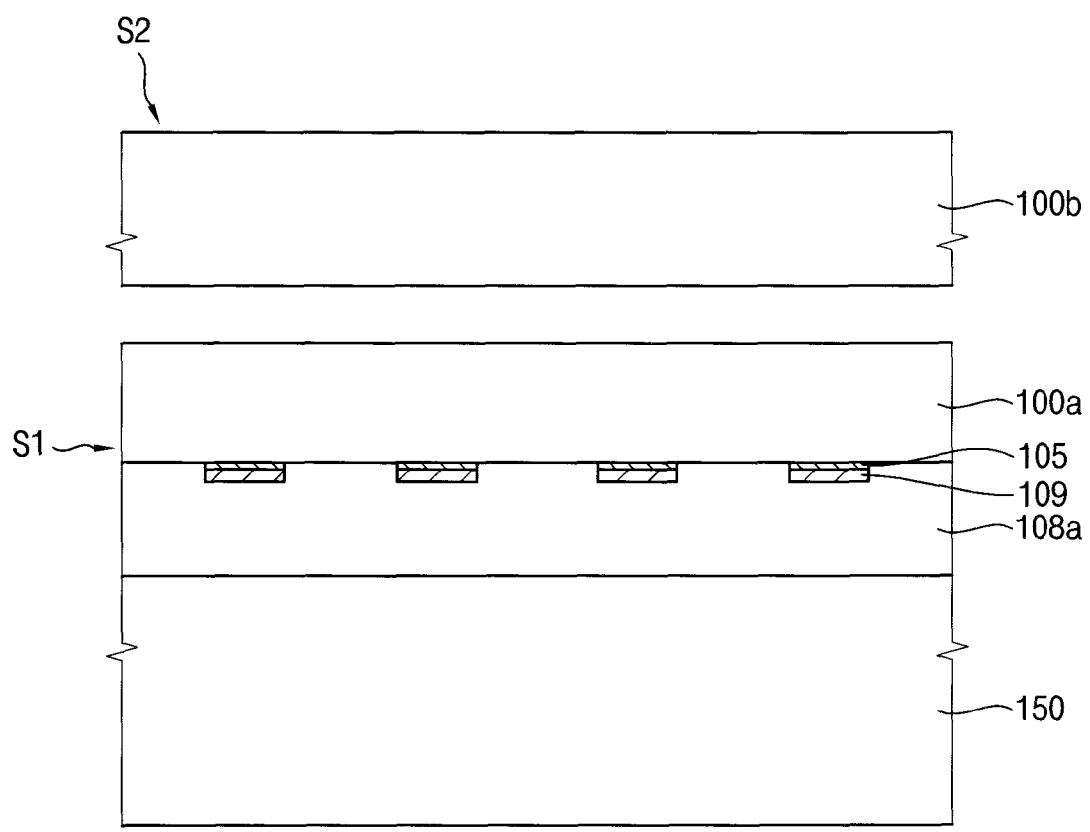

Referring to FIG. 31, donor substrate 100 is cut at hydrogen ion implantation region 102 so that donor substrate 100 is separated into two single crystalline semiconductor layers 100a and 100b. The cutting is performed at a temperature above about 400° C. By the cutting process, single crystalline semiconductor layer 100a is formed on insulation layer 108a and barrier layer pattern 105. Single crystalline semiconductor layer 100a typically has a thickness below about 1 µm. Preferably, single crystalline semiconductor layer 100a has a thickness of about 1,000 to about 6,000 Å.

The above-described buried wiring type substrate can be applied to various types of devices, such as DRAM devices, memory cards, USB memories, and solid-state drives (SSD).

Figure 32:
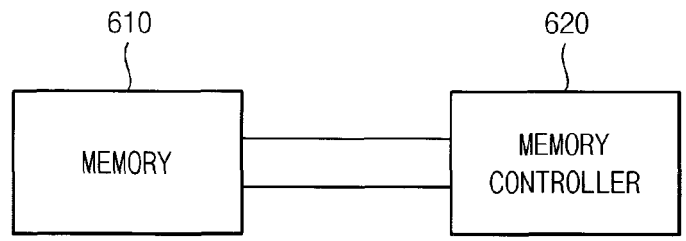
FIG. 32 is a block diagram illustrating a device incorporating a buried wiring type substrate according to an embodiment of the inventive concept.

FIG. 32 is a block diagram illustrating a device comprising a buried wiring type substrate according to an embodiment of the inventive concept.

The device of FIG. 32 comprises a memory 610 and a memory controller 620. Memory 610 comprises a buried wiring type substrate as described above in relation to other embodiments. Memory controller 620 provides memory 610 with an input signal for controlling operation of memory 610. For example, memory controller 620 may transfer a command of a host (not shown) to memory 610 and control various data of memory 610 based on an applied control signal.

Figure 33:
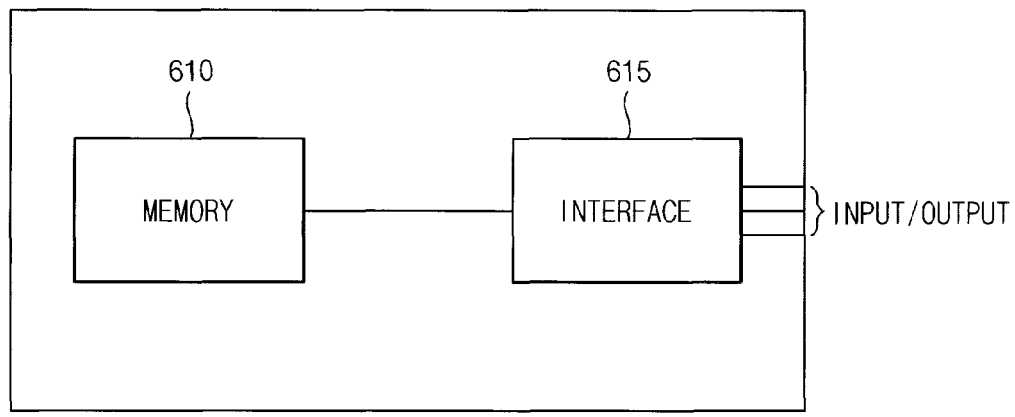
FIG. 33 is a block diagram illustrating a device comprising a buried wiring type substrate according to an embodiment of the inventive concept.

FIG. 33 is a block diagram illustrating another device comprising a buried wiring type substrate according to an embodiment of the inventive concept.

The device of FIG. 33 comprises memory 610 and an interface 615. Memory 610 comprises a buried wiring type substrate as described above in relation to other embodiments. Interface 615 provides memory 610 with an input signal generated by an external source. For example, interface 615 may provide a command and an address signal. Memory 610 is controlled by the control signal provided by interface 615.

Figure 34:
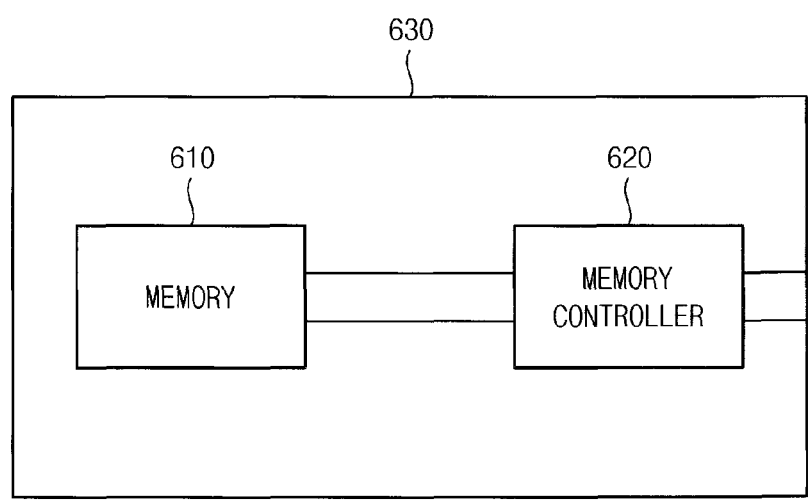
FIG. 34 is a block diagram illustrating a memory card comprising a buried wiring type substrate according to an embodiment of the inventive concept.

FIG. 34 is a block diagram illustrating a memory card comprising a buried wiring type substrate according to an embodiment of the inventive concept. The memory card of FIG. 34 is substantially the same as the device illustrated with reference to FIG. 32, except that the memory and the memory controller are incorporated in a memory card 630.

Memory card 630 can be incorporated in various devices, such as a digital camera or a personal computer.

In some embodiments, a semiconductor device comprises a buried wiring serving as a bit line under a first active structure to provide a low resistance and highly integrated structure. The first and second active structures can be electrically isolated by first and second field insulation layer patterns to prevent a p-n junction from being generated between well regions in the cell region or the peripheral circuit region. Accordingly, the semiconductor device can have enhanced electrical characteristics and reliability.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the inventive concept. Accordingly, all such modifications are intended to be included within the scope of the inventive concept as defined in the claims.

What is claimed is:

1. A method of manufacturing a semiconductor device, comprising:

implanting hydrogen ions into a donor substrate through a first surface thereof to form an ion implantation region, the donor substrate comprising a single crystalline semiconductor;

forming a conductive layer comprising a metal on the first surface of the donor substrate;

forming an insulation layer comprising silicon oxide on the conductive layer;

bonding the insulation layer to a support substrate;

cutting the donor substrate at the ion implantation region to form a single crystalline semiconductor layer;

patterning the single crystalline semiconductor layer in a first region to form a first active structure comprising a first lower pattern and a first upper pattern, the first lower pattern extending in a first direction, and the first upper pattern protruding from the first lower pattern;

etching the conductive layer using the first active structure as an etching mask to form a buried wiring between the first active structure and the insulation layer, the buried wiring extending in the first direction;

sequentially forming a first gate insulation layer and a first gate electrode on a sidewall of the first upper pattern;

forming a first impurity region at the first lower pattern, the first impurity region being electrically connected to the buried wiring; and forming a second impurity region at the first upper pattern, the second impurity region being formed above the first gate electrode.

2. The method of claim 1, further comprising:

forming an insulating interlayer on the insulation layer to cover the first active structure;

forming a first contact plug through the insulating interlayer, the first contact plug being electrically connected to the first gate electrode; and forming a second contact plug through the insulating interlayer, the second contact plug being electrically connected to the first impurity region and the buried wiring.

3. The method of claim 1, further comprising:

patterning the single crystalline semiconductor layer in a second region to form a second active structure; and etching the conductive layer using the second active structure as an etching mask to form a conductive structure.

4. The method of claim 1, wherein the first impurity region makes contact with the buried wiring.

5. The method of claim 1, wherein forming the first active structure comprises:

forming a first mask on the single crystalline semiconductor layer, the first mask extending in the first direction;

partially etching the single crystalline semiconductor layer using the first mask to form a preliminary first upper pattern;

partially etching the crystalline semiconductor layer to form the lower pattern below the first upper pattern;

forming a second mask on the preliminary first upper pattern, the second mask extending in a second direction substantially perpendicular to the first direction; and patterning the preliminary first upper pattern using the second mask as an etching mask to form the first upper pattern.

6. The method of claim 5, further comprising:

forming a spacer on a sidewall of the preliminary first upper pattern; and implanting first impurities into the single crystalline semiconductor layer to form a preliminary first impurity region.

7. The method of claim 6, wherein partially etching the crystalline semiconductor layer to form the lower pattern comprises converting the preliminary first impurity region to a first impurity region.

8. The method of claim 3, further comprising:

forming a second gate insulation layer on the second active structure;

forming a second gate electrode on the second gate insulation layer; and forming third and fourth impurity regions at upper portions of the second upper pattern adjacent to the second gate electrode.

* * * * *